(12) United States Patent
Tojima

(10) Patent No.: US 11,937,006 B2
(45) Date of Patent: Mar. 19, 2024

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Kenzo Tojima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/315,865

(22) Filed: May 11, 2023

(65) Prior Publication Data

US 2023/0370741 A1 Nov. 16, 2023

(30) Foreign Application Priority Data

May 16, 2022 (JP) ................. 2022-080115

(51) Int. Cl.
*H04N 25/75* (2023.01)
*H01L 31/107* (2006.01)
*H04N 25/773* (2023.01)

(52) U.S. Cl.
CPC ........... *H04N 25/75* (2023.01); *H01L 31/107* (2013.01); *H04N 25/773* (2023.01)

(58) Field of Classification Search
CPC ..... H04N 25/75; H04N 25/773; H01L 31/107
See application file for complete search history.

(56) References Cited

U.S. PATENT DOCUMENTS

2019/0182442 A1* 6/2019 Ikedo ............... H04N 25/42

FOREIGN PATENT DOCUMENTS

JP 2020123847 A 8/2020

OTHER PUBLICATIONS

Jun Ogi et al.; "A 250fps 124dB Dynamic-Range SPAD Image Sensor Stacked with Pixel-Parallel Photon Counter Employing Sub-Frame Extrapolating Architecture for Motion Artifact Suppression;" ISSCC 2021 / Session 7 / Imagers and Range Sensors / 7.5; pp. 1-3.

* cited by examiner

*Primary Examiner* — Thanh Luu
(74) *Attorney, Agent, or Firm* — CANON U.S.A., INC. IP Division

(57) ABSTRACT

A photoelectric conversion apparatus includes a plurality of pixels including a photodiode configured to perform avalanche multiplication, and a signal processing circuit configured to generate a signal. The signal processing circuit includes a control circuit, a counter, and an illuminance determination circuit. The control circuit is connected to the photodiode and a generation circuit configured to generate a pulse signal, and controls a state between a first state, and a second state, in accordance with the pulse signal. The counter counts the number of periods in which avalanche multiplication occurs, among a plurality of periods in the first state. The illuminance determination circuit determines whether a count value of the counter has reached a threshold value. The signal processing circuit includes a circuit configured to set a frequency of the pulse signal in accordance with a result of determination performed by the illuminance determination circuit.

19 Claims, 21 Drawing Sheets

COUNTER CIRCUIT

TIME COUNTER CIRCUIT

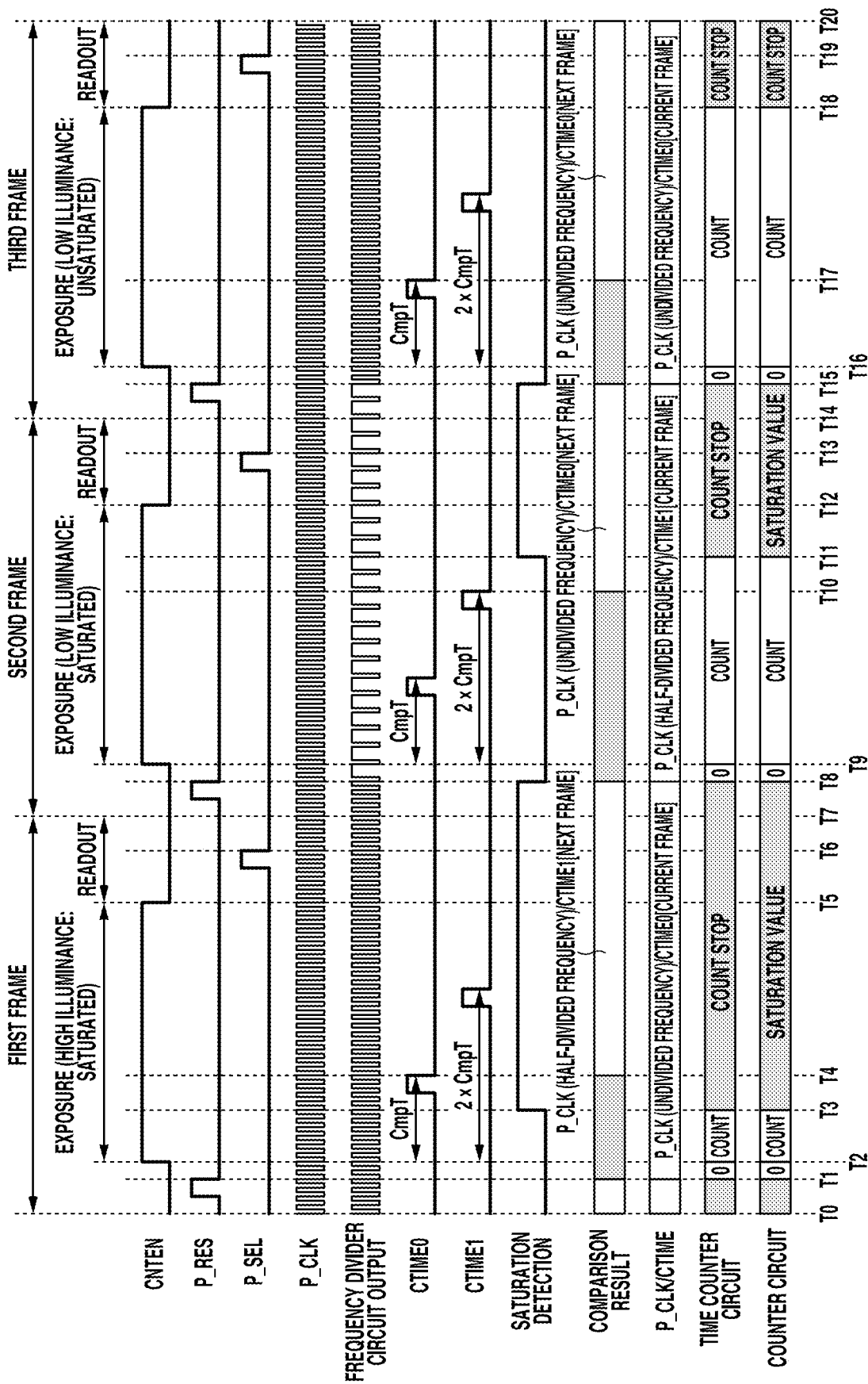

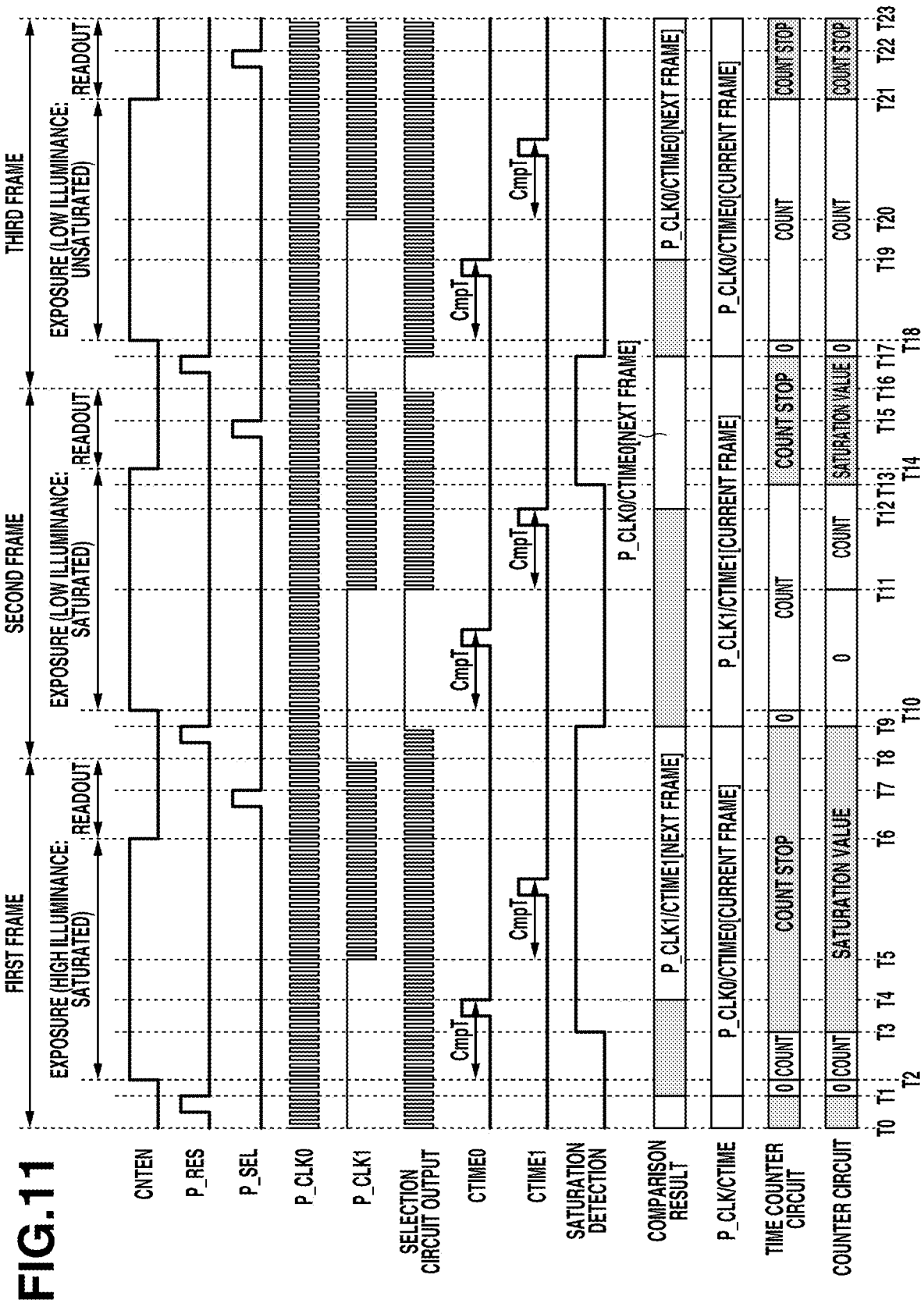

PHOTOELECTRIC CONVERSION APPARATUS AND PHOTOELECTRIC CONVERSION SYSTEM

BACKGROUND

Technical Field

One disclosed aspect of the embodiments relates to structures of a photoelectric conversion apparatus and a photoelectric conversion system.

Description of the Related Art

There has been known a photoelectric conversion apparatus including a pixel array in which pixels including a plurality of avalanche diodes (APDs) are arranged on a plurality of rows and a plurality of columns.

Japanese Patent Application Laid-Open No. 2020-123847 discusses an APD, a quench circuit connected to the APD, a signal control circuit to which a signal output from the APD is input, and a pulse generation circuit connected to the quench circuit and the signal control circuit.

ISSCC2021 Session 7-5 A 250 fps 124 dB Dynamic-Range single photon avalanche diode (SPAD) Image Sensor Stacked with Pixel-Parallel Photon Counter Employing Subframe Extrapolating Architecture for Motion Artifact Suppression Jun Ogi (Sony) discusses a technique of counting the number of signals attributed to a single photon output from an APD, and, in a case where a counter is saturated, recording a saturation time and stopping an operation of the APD.

If the technique discussed in ISSCC2021 Session 7-5 A 250 fps 124 dB Dynamic-Range SPAD Image Sensor Stacked with Pixel-Parallel Photon Counter Employing Subframe Extrapolating Architecture for Motion Artifact Suppression Jun Ogi (Sony) is applied to the photoelectric conversion apparatus discussed in Japanese Patent Application Laid-Open No. 2020-123847, power consumption occurs only in the first half of a frame because an operation of the APD is stopped in the first half of the frame in a case where a counted number reaches a threshold value (e.g., a count value at which a counter is saturated) in the first half of the frame. This leads to such an issue that power consumption becomes unbalanced between the first half of a frame and the second half of the frame, and power consumption cannot be leveled within the frame.

SUMMARY

According to an aspect of the embodiments, a photoelectric conversion apparatus includes a plurality of pixels including a photodiode configured to perform avalanche multiplication, and a signal processing circuit configured to generate a signal that is based on photons detected by the photodiode. The signal processing circuit includes a control circuit, a counter, and an illuminance determination circuit. The control circuit is connected to the photodiode and a generation circuit configured to generate a pulse signal, and controls a state between a first state in which one node of the photodiode is not electrically connected to a predetermined potential and a second state in which the one node is electrically connected to the predetermined potential, in accordance with the pulse signal. The counter counts the number of periods in which avalanche multiplication occurs, among a plurality of periods in the first state. The illuminance determination circuit determines whether a count value of the counter has reached a threshold value. The signal processing circuit includes a circuit configured to set a frequency of the pulse signal in accordance with a result of determination performed by the illuminance determination circuit.

According to another aspect of the embodiments, a photoelectric conversion apparatus includes a plurality of pixels including a photodiode configured to perform avalanche multiplication, and a signal processing circuit configured to generate a signal that is based on a photons detected by the photodiode. The signal processing circuit includes a control circuit, a counter, and an illuminance determination circuit. The control circuit is connected to the photodiode and a generation circuit configured to generate a pulse signal, and controls a state between a first state in which one node of the photodiode is not electrically connected to a predetermined potential, and a second state in which the one node is electrically connected to the predetermined potential, in accordance with the pulse signal. The counter counts the number of periods in which avalanche multiplication occurs, among a plurality of periods in the first state. The illuminance determination circuit determines whether a count value of the counter has reached a threshold value. The signal processing circuit includes a circuit configured to set an oscillation start timing of the pulse signal in accordance with a result of determination performed by the illuminance determination circuit.

Further features of the disclosure will become apparent from the following description of exemplary embodiments with reference to the attached drawings.

BRIEF DESCRIPTION OF THE DRAWINGS

FIG. 8 is a timing chart illustrating an operation of the signal processing circuit according to the first exemplary embodiment.

FIG. 11 is a timing chart illustrating an operation of A signal processing circuit according to a third exemplary embodiment.

DESCRIPTION OF THE EMBODIMENTS

Figure 1:
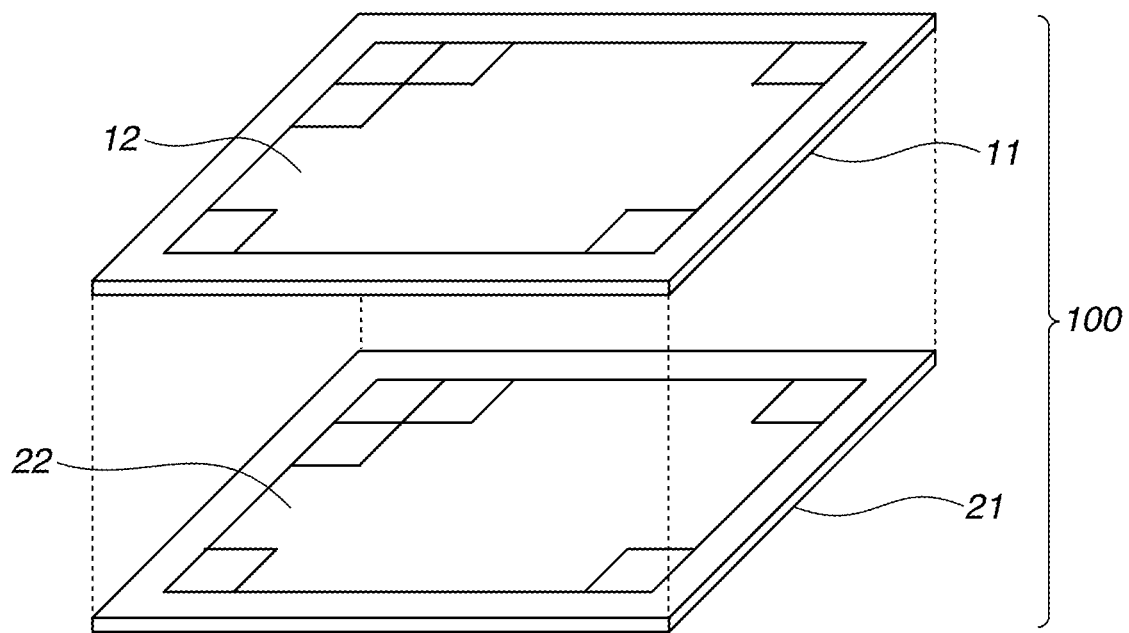
FIG. 1 is a diagram illustrating a configuration of a photoelectric conversion apparatus according to an exemplary embodiment.

The following exemplary embodiments are provided to embody the technical idea of the disclosure, and are not intended to limit the disclosure. The sizes and the positional relationship of members illustrated in the drawings are sometimes exaggerated to clarify the description. In the following description, the same components are assigned the same reference numerals, and the description thereof will be sometimes omitted. In the following, the term "unit" may have different meanings depending on the context. The usual meaning is an individual element, single and complete. The phrase "units of" may refer to a plurality of elements or a group of elements. In addition, the term "unit" may refer to a software context, a hardware context, or a combination of software and hardware contexts. In the software context, the term "unit" refers to a functionality, an application, a software module, a function, a routine, a set of instructions, or a program that can be executed by a programmable processor such as a microprocessor, a central processing unit (CPU), or a specially designed programmable device or controller. A memory contains instructions or program that, when executed by the CPU, cause the CPU to perform operations corresponding to units or functions. In the hardware context, the term "unit" refers to a hardware element, a circuit, an assembly, a physical structure, a system, a module, or a subsystem. It may include mechanical, optical, or electrical components, or any combination of them. It may include active (e.g., transistors) or passive (e.g., capacitor) components. It may include semiconductor devices having a substrate and other layers of materials having various concentrations of conductivity. It may include a CPU or a programmable processor that can execute a program stored in a memory to perform specified functions. It may include logic elements (e.g., AND, OR) implemented by transistor circuits or any other switching circuits. In the combination of software and hardware contexts, the term "unit" or "circuit" refers to any combination of the software and hardware contexts as described above. In addition, the term "element," "assembly," "component," or "device" may also refer to "circuit" with or without integration with packaging materials. Furthermore, depending on the context, the term "portion," "part," "device," "switch," or similar terms may refer to a circuit or a group of circuits. The circuit or group of circuits may include electronic, mechanical, or optical elements such as capacitors, diodes, transistors. For example, a switch is a circuit that turns on and turns off a connection. It can be implemented by a transistor circuit or similar electronic devices.

Configurations common to photoelectric conversion apparatuses according to exemplary embodiments will be described with reference to FIGS. 1 to 5. The photoelectric conversion apparatus includes a SPAD pixel including an APD. Among charge pairs generated in an avalanche diode, the conductivity type of charges to be used as signal charges will be referred to as a first conductivity type. The first conductivity type refers to a conductivity type in which charges of the same polarity as the polarity of signal charges are regarded as majority carriers. In contrast, a conductivity type opposite to the first conductivity type will be referred to as a second conductivity type. The following description will be given of an example in which signal charges are electrons, the first conductivity type is an N-type, and the second conductivity type is a P-type. However, signal charges can be holes, the first conductivity type can be the P-type, and the second conductivity type can be the N-type.

While signals are read out from a cathode of an APD in a case where signal charges are electrons, signals are read out from an anode of an APD in a case where signal charges are holes. Accordingly, the cathode and the anode of the APD have an opposite relationship.

In this specification, a "planar view" refers to a view from a direction vertical to a light incidence surface of a semiconductor layer in which photoelectric conversion elements to be described below are arranged. A cross section refers to a surface in the direction vertical to the light incidence surface of the semiconductor layer in which the photoelectric conversion elements are arranged. In a case where the light incidence surface of the semiconductor layer is a rough surface when viewed microscopically, a planar view is defined based on a light incidence surface of a semiconductor layer that is viewed macroscopically.

In the following description, an anode of an APD is set to a fixed potential, and signals are taken out from a cathode side. Thus, a semiconductor region of the first conductivity type in which charges having the same polarity as the polarity of signal charges are regarded as majority carriers is an N-type semiconductor region, and a semiconductor region of the second conductivity type in which charges having a polarity different from the polarity of signal charges are regarded as majority carriers is a P-type semiconductor region. Even in a case where a cathode of an APD is set to a fixed potential, and signals are taken out from an anode side, the disclosure can be realized. In this case, a semiconductor region of the first conductivity type in which charges having the same polarity as the polarity of signal charges are regarded as majority carriers is a P-type semiconductor region, and a semiconductor region of the second conductivity type in which charges having a polarity different from the polarity of signal charges are regarded as majority carriers is an N-type semiconductor region. The following description will be given of a case where one node of an APD is set to a fixed potential, but potentials of both nodes can be made variable.

In this specification, in a case where a term "impurity concentration" is simply used, the term means a net impurity concentration obtained by subtracting an amount compensated by an impurity of an opposite conductivity type. In short, the "impurity concentration" refers to a NET doping concentration. A region in which a P-type additive impurity concentration is higher than an N-type additive impurity concentration is the P-type semiconductor region. In contrast, a region in which an N-type additive impurity concentration is higher than a P-type additive impurity concentration is the N-type semiconductor region.

A configuration that is common to the exemplary embodiments will now be described.

FIG. 1 is a diagram illustrating a configuration of a photoelectric conversion apparatus 100 according to an exemplary embodiment. The following description will be given using an example case where the photoelectric conversion apparatus 100 is a stack-type photoelectric conversion apparatus. In other words, the description will be given using, as an example, a photoelectric conversion apparatus including two stacked substrates corresponding to a sensor substrate 11 and a circuit substrate 21, which are electrically connected. Nevertheless, the photoelectric conversion apparatus is not limited to this. For example, the photoelectric conversion apparatus 100 can be a photoelectric conversion apparatus in which components included in the sensor substrate 11 and components included in the circuit substrate 21, which will be described below, are arranged in a common semiconductor layer. In the following description, the photoelectric conversion apparatus in which components included in the sensor substrate 11 and components included in the circuit substrate 21 are arranged in a common semiconductor layer will also be referred to as a non-stacked photoelectric conversion apparatus.

The sensor substrate 11 includes a first semiconductor layer including a photoelectric conversion element 102 to be described below, and a first wiring structure. The circuit substrate 21 includes a second semiconductor layer including a circuit such as a signal processing circuit 103 to be described below, and a second wiring structure. The photoelectric conversion apparatus 100 includes the second semiconductor layer, the second wiring structure, the first wiring structure, and the first semiconductor layer, which are stacked in this order.

FIG. 1 illustrates a back-illuminated photoelectric conversion apparatus that receives light entering from a first surface, and includes a circuit substrate arranged on a second surface being a surface opposite to the first surface. In a case where the photoelectric conversion apparatus 100 is a non-stacked photoelectric conversion apparatus, a surface on which a transistor of a signal processing circuit is arranged will be referred to as a second surface. In a case where the photoelectric conversion apparatus 100 is a back-illuminated photoelectric conversion apparatus, the first surface of a semiconductor layer that is on the opposite side of the second surface thereof serves as a light incidence surface. In a case where the photoelectric conversion apparatus 100 is a front-illuminated photoelectric conversion apparatus, the second surface of a semiconductor layer serves as a light incidence surface.

In the following description, the sensor substrate 11 and the circuit substrate 21 will be described as diced chips, but the sensor substrate 11 and the circuit substrate 21 are not limited to such chips. For example, each substrate can be a wafer. Alternatively, the substrates can be diced after being stacked in a wafer state, or can be diced into chips and then jointed by stacking the chips.

A pixel region 12 is arranged on the sensor substrate 11, and a circuit region 22 for processing signals detected in the pixel region 12 is arranged on the circuit substrate 21.

Figure 2:
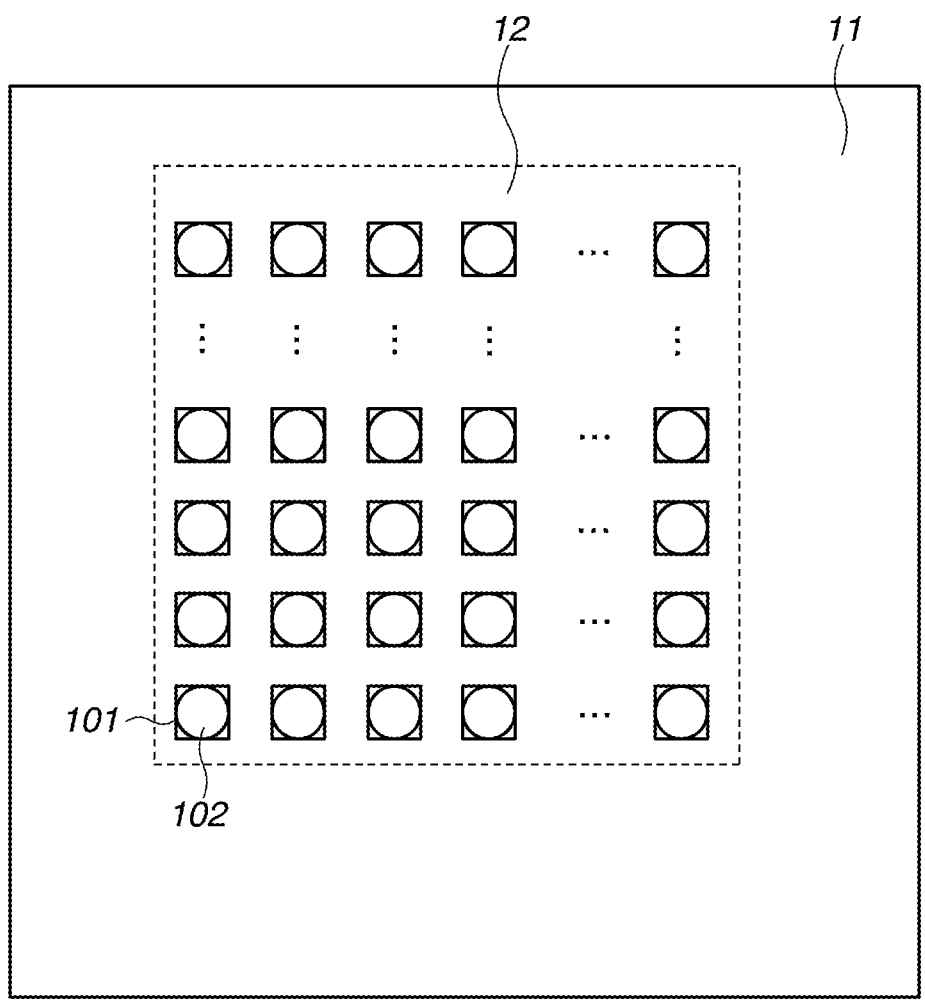
FIG. 2 illustrates an arrangement example of a sensor substrate of a photoelectric conversion apparatus according to an exemplary embodiment.

FIG. 2 is a diagram illustrating an arrangement example of the sensor substrate 11. Pixels 101 each including the photoelectric conversion element 102 having an avalanche photodiode (hereinafter, APD) are arranged in a two-dimensional array in a planar view, and form the pixel region 12.

The pixel 101 is typically a pixel for forming an image. In a case where the pixel 101 is used in a time of flight (TOF) sensor, an image needs not be always formed. That is, the pixel 101 can be a pixel for measuring a time at which light reaches, and for measuring a light amount.

Figure 3:
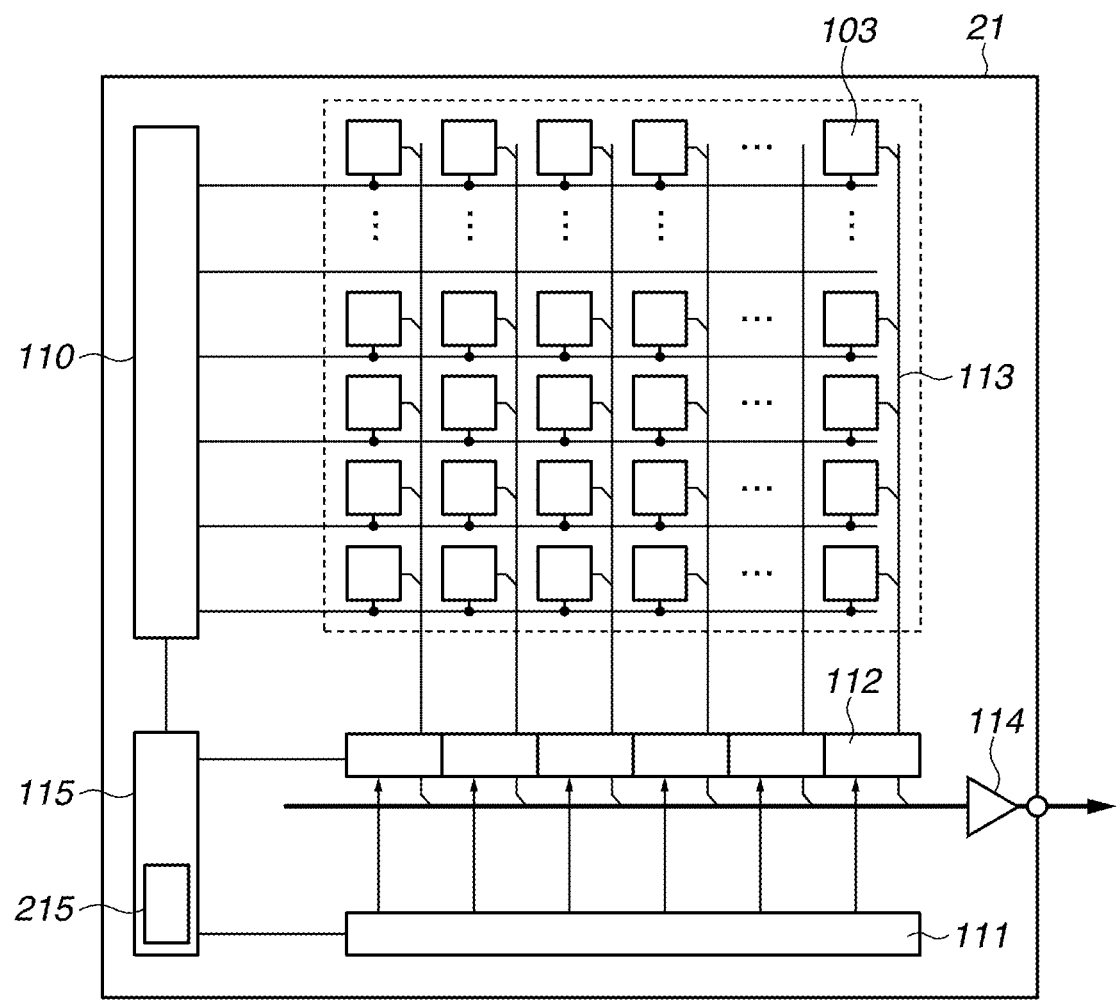
FIG. 3 illustrates an arrangement example of a circuit substrate of a photoelectric conversion apparatus according to an exemplary embodiment.

FIG. 3 is a configuration diagram of the circuit substrate 21. The circuit substrate 21 includes the signal processing circuit 103 that processes charges photoelectrically-converted by the photoelectric conversion element 102 illustrated in FIG. 2, a readout circuit 112, a control pulse generation unit or circuit 115, a horizontal scanning circuit 111, a signal line 113, and a vertical scanning circuit 110.

The photoelectric conversion element 102 illustrated in FIG. 2 and the signal processing circuit 103 illustrated in FIG. 3 are electrically connected via a connection wire provided for each pixel.

The vertical scanning circuit 110 receives a control pulse supplied from the control pulse generation circuit 115, and supplies the control pulse to each pixel. A logic circuit, such as a shift register or an address decoder, is used as the vertical scanning circuit 110.

Figure 4A:
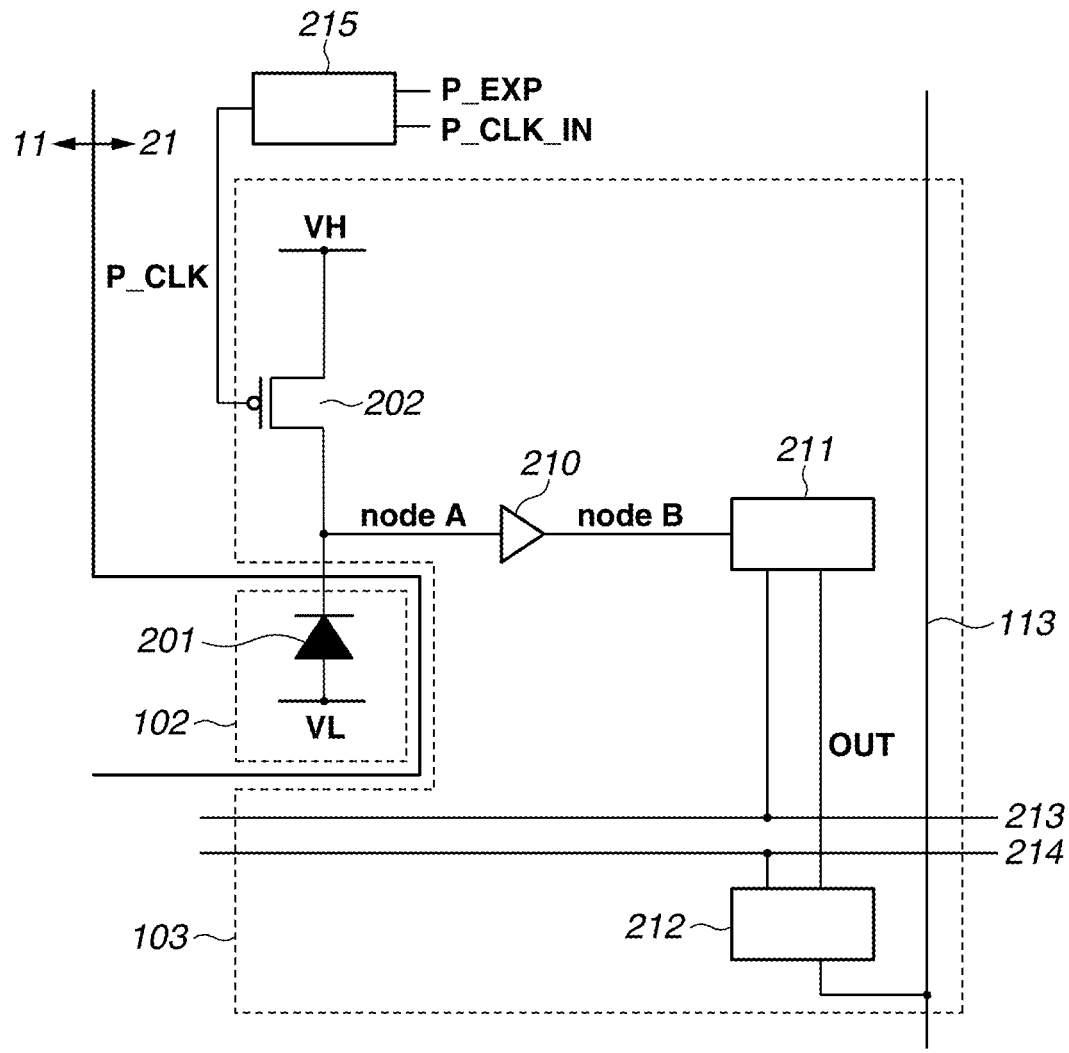
FIGS. 4A and 4B are block diagrams including an equivalent circuit of a photoelectric conversion element of a photoelectric conversion apparatus according to an exemplary embodiment.
Figure 4B:
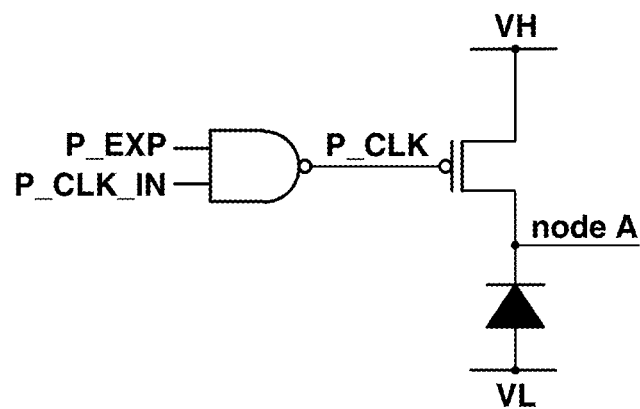

The control pulse generation circuit 115 includes a signal generation unit or circuit 215 that generates a control signal P_CLK of a switch to be described below. As described below, the signal generation circuit 215 generates a pulse signal for controlling the switch. As illustrated in FIG. 4A, for example, the signal generation circuit 215 can generate a common control signal P_CLK for a plurality of pixels in a pixel region, or the signal generation circuit 215 can generate the control signal P_CLK for each pixel as illustrated in FIG. 4B. In a case where the signal generation circuit 215 generates the common control signal P_CLK, the signal generation circuit 215 generates the control signal P_CLK in common in such a manner that at least any one of a cycle of a pulse signal P_EXP for controlling an exposure period, the number of pulses, and a pulse width corresponds to an exposure period. In a case where the signal generation circuit 215 generates the control signal P_CLK for each pixel, the signal generation circuit 215 can generate the control signal P_CLK using both an input signal P_CLK_IN output from the control pulse generation circuit 115 and the pulse signal P_EXP for controlling an exposure period. The control pulse generation circuit 115 desirably includes a frequency divider circuit, for example. This enables simple control and reduces an increase in the number of elements.

A signal output from the photoelectric conversion element 102 of a pixel is processed by the signal processing circuit 103.

A counter and a memory are provided in the signal processing circuit 103, and a digital value is stored in the memory.

The horizontal scanning circuit 111 inputs, to the signal processing circuit 103, a control pulse for sequentially selecting each column to read out a signal from the memory of each pixel that stores a digital signal.

A signal is output to the signal line 113 from the signal processing circuit 103 corresponding to a pixel selected by the vertical scanning circuit 110 on a selected column.

The signal output to the signal line 113 is output via an output circuit 114 to a recording unit or circuit or a signal processing unit or circuit that is provided on the outside of the photoelectric conversion apparatus 100.

In FIG. 2, photoelectric conversion elements in a pixel region can be one-dimensionally arrayed. Even in a case where the number of pixels is one, the effect of the disclosure can be obtained, and a case where the number of pixels is one is also included in the disclosure. Nevertheless, if a photoelectric conversion apparatus includes a plurality of pixels, a power consumption reduction effect of the present exemplary embodiment can be obtained more easily. The function of the signal processing circuit needs not be provided for each of all photoelectric conversion elements. For example, one signal processing circuit can be shared by a plurality of photoelectric conversion elements, and signal processing can be sequentially performed.

As illustrated in FIGS. 2 and 3, a plurality of signal processing circuits 103 is arranged in a region overlapping the pixel region 12 in a planar view. The vertical scanning circuit 110, the horizontal scanning circuit 111, the readout circuit 112, the output circuit 114, and the control pulse generation circuit 115 are arranged in such a manner as to overlap, in a planar view, a region defined by the ends of the sensor substrate 11 and the ends of the pixel region 12. In other words, the sensor substrate 11 includes the pixel region 12, and a non-pixel region arranged around the pixel region 12. The vertical scanning circuit 110, the horizontal scanning circuit 111, the readout circuit 112, output circuit 114, and the control pulse generation circuit 115 are arranged in a region overlapping the non-pixel region in a planar view.

The arrangement of the signal lines 113, and the arrangement of the readout circuit 112 and the output circuit 114 are not limited to those illustrated in FIG. 3. For example, the signal lines 113 can be arranged with extending in a row direction, and the readout circuit 112 can be arranged at the end of the extension of the signal lines 113.

FIGS. 4A and 4B each illustrate an example of a block diagram including an equivalent circuit illustrated in FIGS. 2 and 3. FIG. 4A illustrates an example in which the signal generation circuit 215 is provided in common to a plurality of pixels. FIG. 4B illustrates an example in which the control signal P_CLK can be controlled for each pixel.

In FIG. 4A, the photoelectric conversion element 102 including an APD 201 is provided on the sensor substrate 11, and other members are provided on the circuit substrate 21.

The APD 201 generates a charge pair corresponding to incident light, by photoelectric conversion. One node of two nodes of the APD 201 is connected with a control line to which a drive voltage VL (first voltage) is supplied. The other node of the two nodes of the APD 201 is connected with a control line to which a drive voltage VH (second voltage) higher than the drive voltage VL supplied to the anode is supplied. In FIG. 4A, one node of the APD 201 is an anode, and the other node of the APD 201 is a cathode. The anode and the cathode of the APD 201 are supplied with Inversely-biased voltages for causing the APD 201 to perform an avalanche multiplication operation. By causing a state in which such voltages are supplied, charges generated by incident light cause avalanche multiplication, and an avalanche current is generated.

In a case where inversely-biased voltages are supplied, an APD is operated in a Geiger mode or a linear mode. In the Geiger mode, an APD is operated with a potential difference between the anode and the cathode that is larger than a breakdown voltage. In the linear mode, an APD is operated with a potential difference between the anode and the cathode that is near a breakdown voltage, or with a voltage difference smaller than or equal to the breakdown voltage.

An APD operated in the Geiger mode is referred to as an SPAD. For example, the voltage VL (first voltage) is −30 V (volts) and the voltage VH (second voltage) is 1 V. The APD 201 can be operated in the linear mode or in the Geiger mode. The SPAD is desirably used because a potential difference of the SPAD becomes larger and a pressure resistance effect of the SPAD becomes more prominent as compared with an APD in the linear mode.

A switch 202 is connected to the control line to which the drive voltage VH is supplied, and the APD 201. The switch 202 is connected to one node of an anode and a cathode of the APD 201.

The switch 202 switches a potential difference between the anode and the cathode of the APD 201, between a first potential difference for causing avalanche multiplication and a second potential difference for not causing avalanche multiplication. Hereinafter, switching from the second potential difference to the first potential difference will also be referred to as turning the switch 202 on, and switching from the first potential difference to the second potential difference will also be referred to as turning the switch 202 off. The switch 202 functions as a quench element. The switch 202 functions as a load circuit (quench circuit) when a signal is multiplied by avalanche multiplication. The switch 202 has a function of suppressing avalanche multiplication by reducing a voltage to be supplied to the APD 201 (quench operation). The switch 202 also has a function of returning a voltage to be supplied to the APD 201, to the drive voltage VH by flowing a current by an amount corresponding to a voltage drop caused by the quench operation (recharge operation). That is, the switch 202 functions as a control circuit that controls the occurrence of avalanche multiplication in the APD 201.

The switch 202 can include, for example, a metal-oxide semiconductor (MOS) transistor. FIG. 4A illustrates a case where the switch 202 is a P-channel MOS (PMOS) transistor. The control signal P_CLK of the switch 202 that is supplied from the signal generation circuit 215 is applied to a gate electrode of the MOS transistor included in the switch 202. In the present exemplary embodiment, on and off control of the switch 202 is performed by controlling an applied voltage to the gate electrode of the switch 202.

The signal processing circuit 103 includes a waveform shaping unit or circuit 210, a counter circuit 211, and a selection circuit 212. In FIG. 4A, the signal processing circuit 103 includes the waveform shaping circuit 210, the counter circuit 211, and the selection circuit 212, but in this specification, the signal processing circuit 103 is only required to include at least any one of the waveform shaping circuit 210, the counter circuit 211, and the selection circuit 212.

Figure 5:
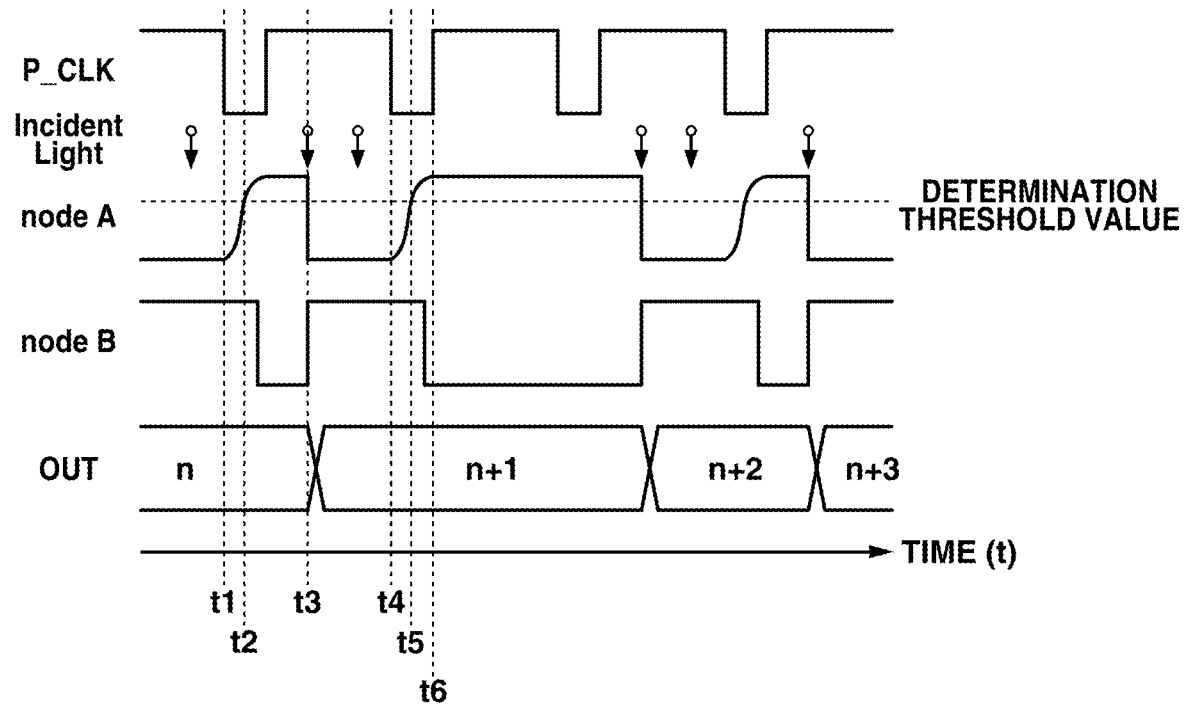
FIG. 5 is a diagram illustrating a relationship between an operation of an avalanche photodiode (APD) of a photoelectric conversion apparatus and an output signal according to an exemplary embodiment.

The waveform shaping circuit 210 outputs a pulse signal by shaping a potential change of the cathode of the APD 201 that is obtained at the time of photon detection. An input side node of the waveform shaping circuit 210 is regarded as a node A and an output side node of the waveform shaping circuit 210 is regarded as a node B. The waveform shaping circuit 210 changes an output potential from the node B depending on whether an input potential to the node A is larger than or equal to a predetermined value or lower than the predetermined value. In FIG. 5, if an input potential to the node A becomes a high potential larger than or equal to a determination threshold value, an output potential from the node B becomes a low level. If an input potential to the node A becomes a potential lower than the determination threshold value, an output potential from the node B becomes a high level. For example, an inverter circuit is used as the waveform shaping circuit 210. FIG. 4A illustrates an example in which one inverter is used as the waveform shaping circuit 210, but a circuit in which a plurality of inverters is connected in series can be used, or another circuit having a waveform shaping effect can also be used.

The quench operation and the recharge operation can be performed using the switch 202 in accordance with avalanche multiplication in the APD 201, but in some cases, a photon is not determined to be an output signal depending on the detection timing of the photon. Assume a case where, for example, avalanche multiplication occurs in an APD, an input potential to the node A becomes a low level, and the recharge operation is performed. The determination threshold value of the waveform shaping circuit 210 is typically set to a potential higher than a potential difference at which avalanche multiplication occurs in an APD. If a photon enters the APD when a potential at the node A is lower than the determination threshold value due to the recharge operation and is a potential at which avalanche multiplication can occur in an APD, avalanche multiplication occurs in the APD and a voltage at the node A drops. In other words, because the potential at the node A drops at a voltage lower than the determination threshold value, an output potential from the node B does not change even though a photon is detected. Although avalanche multiplication occurs, a photon stops being determined as a signal, accordingly. Especially under a high illuminance, photons consecutively enter in a short period, thereby making it difficult to determine the photons as signals. For this reason, in spite of the high illuminance, a discrepancy easily arises between an actual number of incident photons and the number of output signals.

In contrast to this, the photons can be determined as signals by switching between on and off of the switch 202 by applying the control signal P_CLK to the switch 202, even in a case where photons consecutively enter an APD in a short time. FIG. 5 describes an example in which the control signal P_CLK serves as a pulse signal having a repetitive cycle. In other words, a configuration in which on/off of the switch 202 is switched at a predetermined clock frequency will be described with reference to FIG. 5. Nevertheless, an effect of suppressing an increase in power consumption of a photoelectric conversion apparatus can be obtained even if a pulse signal is not a signal having a repetitive cycle.

The counter circuit 211 counts the number of pulse signals output from the waveform shaping circuit 210, and stores a count value. When a control pulse pRES is supplied via a drive line 213, the count value stored in the counter circuit 211 is reset.

A control pulse pSEL is supplied to the selection circuit 212 from the vertical scanning circuit 110 illustrated in FIG. 3 via a drive line 214 illustrated in FIG. 4 (not illustrated in FIG. 3), and electric connection and separation between the counter circuit 211 and the signal line 113 are switched. The selection circuit 212 includes, for example, a buffer circuit for outputting a signal. An output signal OUT illustrated in FIG. 4A is a signal output from a pixel.

Electric connection can be switched between the switch 202 and the APD 201, or between the photoelectric conversion element 102 and the signal processing circuit 103, by arranging a switch, such as a transistor, therebetween. Similarly, the supply of the drive voltage VH or the drive voltage VL to be supplied to the photoelectric conversion element 102 can be electrically switched by using a switch such as a transistor.

In the present exemplary embodiment, the configuration uses the counter circuit 211. Nevertheless, the photoelectric conversion apparatus 100 can be used to acquire a pulse detection timing using a time to digital converter (hereinafter, TDC) and a memory in place of the counter circuit 211. At this time, the generation timing of a pulse signal output from the waveform shaping circuit 210 is converted into a digital signal by the TDC. To measure the timing of a pulse signal, a control pulse pREF (reference signal) is supplied to the TDC via a drive line from the vertical scanning circuit 110 illustrated in FIG. 1. Based on the control pulse pREF, the TDC acquires a digital signal indicating an input timing of a signal output from each pixel via the waveform shaping circuit 210, as a relative time.

As illustrated in FIG. 4B, the signal generation circuit 215 can be provided for each pixel. In FIG. 4B, the waveform shaping circuit 210, a circuit following the waveform shaping circuit 210, and the signal generation circuit 215, which are illustrated in FIG. 4A, are omitted. The signal generation circuit 215 in FIG. 4A is assumed to be provided for each pixel. In FIG. 4B, a logic circuit is provided in a pixel, and whether to supply a pulse signal to the switch 202 is determined. The pulse signal P_EXP for controlling an exposure period, and an input signal P_CLK_IN for controlling the control signal P_CLK are input to the logic circuit. A reversing signal is then output. For example, in a case where the pulse signal P_EXP for controlling an exposure period is at a low level and the input signal P_CLK_IN is at a low level, a high-level signal is output as the control signal P_CLK. In other words, the switch 202 is turned off. In a case where the pulse signal P_EXP for controlling an exposure period is at a high level and the input signal P_CLK_IN is at a high level, a low-level signal is output as the control signal P_CLK. In other words, the switch 202 is turned on. In a case where one of the pulse signal P_EXP for controlling an exposure period and the input signal P_CLK_IN is at the low level, a high-level signal is output as the control signal P_CLK. In other words, the switch 202 is turned off. In this manner, it is desirable to control the switch 202 for each pixel. In a case where the circuit illustrated in FIG. 4B is used, the control signal P_CLK is maintained at the high level if an exposure period P becomes a low level, as described below in a second exemplary embodiment. In other words, the switch 202 is turned off.

FIG. 5 is a diagram schematically illustrating a relationship between the control signal P_CLK of the switch 202, a potential at the node A, a potential at the node B, and an output signal. In the present exemplary embodiment, the drive voltage VH becomes less likely to be supplied to an APD, in a case where the control signal P_CLK is at the high level. In a case where the control signal P_CLK is at the low level, the drive voltage VH is supplied to an APD. The high level of the control signal P_CLK is 1 V, for example. The low level of the control signal P_CLK is 0 V, for example. In a case where the control signal P_CLK is at the high level, the switch 202 is turned off. In a case where the control signal P_CLK is at the low level, the switch 202 is turned on. A resistance value of the switch 202 that is set in a case where the control signal P_CLK is at the high level becomes higher than a resistance value of the switch 202 that is set in a case where the control signal P_CLK is at the low level. In a case where the control signal P_CLK is at the high level, a potential to be supplied to the APD becomes a potential smaller than or equal to a breakdown voltage of the APD because the recharge operation is less likely to be performed even if avalanche multiplication occurs in an APD. Thus, an avalanche multiplication operation in the APD stops.

As illustrated in FIG. 4A, it is desirable that the switch 202 includes one transistor, and the quench operation and the recharge operation are performed using the one transistor. With this configuration, the number of circuits can be reduced as compared with a case where the quench operation and the recharge operation are performed using different circuit elements. Especially in a case where each pixel includes a counter circuit and a signal of an SPAD is read out for each pixel, it is desirable to reduce a circuit area used for a switch for arranging the counter circuits, and an effect obtained by the switch 202 including one transistor becomes prominent.

At a time t1, the control signal P_CLK changes from a high level to a low level, the switch 202 is turned on, and the recharge operation of the APD 201 is started. A potential at the cathode of the APD 201 thereby transitions to a high level. Thereafter, a potential difference between potentials to be applied to the anode and the cathode of the APD 201 becomes a state in which avalanche multiplication can occur. A potential at the cathode is the same as the potential at the node A. When the potential at the cathode transitions from a low level to a high level, the potential at the node A becomes larger than or equal to the determination threshold value at a time t2, accordingly. At this time, a pulse signal output from the node B is reversed from a high level to a low level. Thereafter, a potential difference corresponding to (the drive voltage VH—the drive voltage VL) is applied to the APD 201. The control signal P_CLK becomes the high level, and the switch 202 is turned off.

If a photon enters the APD 201 at a time t3, avalanche multiplication occurs in the APD 201, and a voltage at the cathode drops. In other words, a voltage at the node A drops. If a voltage drop amount further increases, and a potential difference applied to the APD 201 becomes small, avalanche multiplication of the APD 201 stops at the time t2, and a voltage level at the node A stops dropping from a certain fixed value. If the voltage at the node A becomes lower than the determination threshold value while the voltage at the node A is dropping, a voltage at the node B changes from a low level to a high level. In other words, a portion with an output waveform exceeding the determination threshold at the node A is subjected to waveform shaping performed by the waveform shaping circuit 210, and output as a signal at the node B. The signal is then counted by the counter circuit 211, and a count value of counted signals that is to be output from the counter circuit 211 increases by 1 least significant bit (LSB).

A photon enters the APD 201 during a period between times t3 and t4, but the switch 202 is in an off state, and an applied voltage to the APD 201 does not have a potential difference at which avalanche multiplication can occur. Thus, a voltage level at the node A does not exceed the determination threshold value.

At the time t4, the control signal P_CLK changes from the high level to a low level, and the switch 202 is turned on. A current compensating for a voltage drop from the drive voltage VH accordingly flows to the node A, and the voltage at the node A transitions to the original voltage level. At this time, because the voltage at the node A becomes larger than or equal to the determination threshold value at a time t5, a pulse signal at the node B is reversed from the high level to the low level.

At a time t6, the voltage level at the node A is statically settled at the original voltage level, and the control signal P_CLK changes from the low level to the high level. The switch 202 is thus turned off. Subsequently, potentials at each node and signal lines also change in accordance with the control signal P_CLK and photon entrance, as described for the period between the times t1 and t6.

Hereinafter, a photoelectric conversion apparatus according to each exemplary embodiment will be described.

Figure 6:
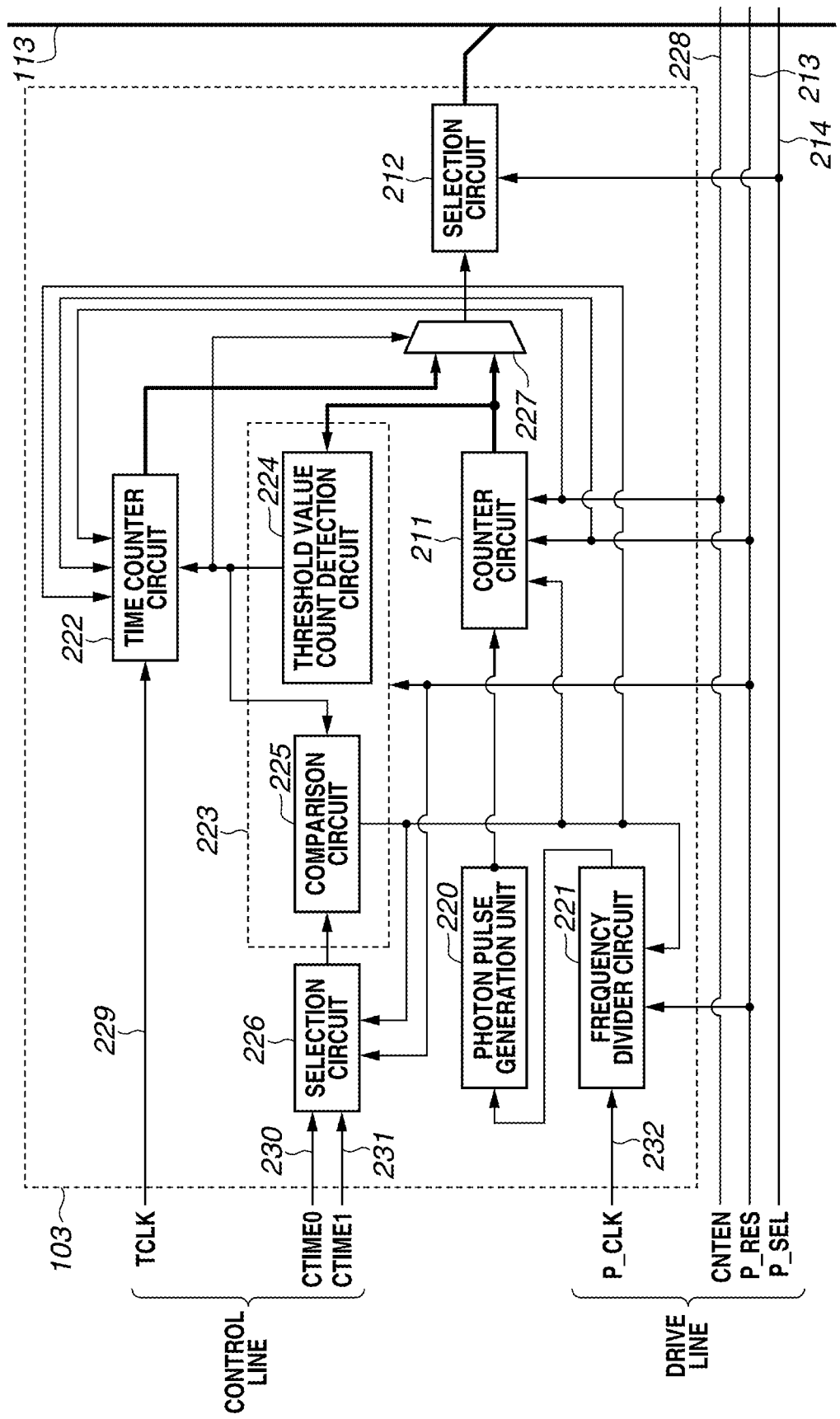
FIG. 6 is a block diagram illustrating a configuration example of a signal processing circuit according to a first exemplary embodiment.

FIG. 6 is a diagram illustrating a configuration example of the signal processing circuit 103 according to the first exemplary embodiment.

The signal processing circuit 103 includes the counter circuit 211, the selection circuit 212, a selection circuit 226, a photon pulse generation unit or circuit 220, a frequency divider circuit 221, a time counter circuit 222, an illuminance determination unit or circuit 223, and a selector 227.

The photon pulse generation circuit 220 includes the switch 202 and the waveform shaping circuit 210. The illuminance determination circuit 223 includes a threshold value count detection circuit 224 and a comparison circuit 225.

The counter circuit 211 counts the number of pulse signals output from the photon pulse generation circuit 220. The counter circuit 211 resets a count value in accordance with the control pulse pRES supplied from the control pulse generation circuit 115 via the vertical scanning circuit 110 and the drive line 213.

The counter circuit 211 starts counting at a rising edge of a drive signal CNTEN supplied from the control pulse generation circuit 115 via the vertical scanning circuit 110 and a drive line 228, and ends the counting at a trailing edge. That is, the drive signal CNTEN is a signal for controlling an exposure time. The counter circuit 211 is, for example, an eight-bit counter.

The threshold value count detection circuit 224 detects that a count value of the counter circuit 211 has reached a predetermined threshold value, and notifies the time counter circuit 222, the comparison circuit 225, and the selector 227 of the detection. In the first exemplary embodiment, the predetermined threshold value is set to 255, which is a saturation value countable by the eight-bit counter, but the predetermined threshold value can be an intermediate value, such as 127 or 63.

The time counter circuit 222 is a counter that measures an exposure time. The time counter circuit 222 starts the counting of an exposure time from an exposure start time point of one frame, and stops the counting if being notified by the threshold value count detection circuit 224 that a count value of the counter circuit 211 has reached the saturation value within a period of the frame. In a case where the time counter circuit 222 is not notified that a count value of the counter circuit 211 has reached the saturation value within the period of one frame, the time counter circuit 222 does not stop the counting in the frame. The time counter circuit 222 also resets a count value in accordance with the control pulse pRES supplied from the control pulse generation circuit 115 via the vertical scanning circuit 110 and the drive line 213. The time counter circuit 222 starts counting at a rising edge of the drive signal CNTEN supplied from the control pulse generation circuit 115 via the vertical scanning circuit 110 and the drive line 228, and ends the counting at a trailing edge. That is, the drive signal CNTEN is a signal for controlling an exposure time. The time counter circuit 222 is, for example, a 14-bit counter and counts a clock edge of a time clock (TCLK) supplied from the outside of the signal processing circuit 103 via a control line 229.

FIG. 6 illustrates a configuration in which the signal processing circuit 103 includes the time counter circuit 222. However, the configuration is not limited to this configuration as long as a time at which a count value of the counter circuit 211 has reached the saturation value within a period of one frame can be acquired. For example, the signal processing circuit 103 can include a latch circuit, and a time code can be constantly input to the latch circuit from the outside of the signal processing circuit 103. In this case, if the latch circuit is notified that a count value of the counter circuit 211 has reached the saturation value within a period of one frame, the latch circuit latches a time code. Alternatively, the counter circuit 211 can count the number of pulse signals output from the photon pulse generation circuit 220 until a count value of the counter circuit 211 reaches the saturation value within a period of one frame, for example. At this time, if a count value of the counter circuit 211 reaches the saturation value within a period of one frame, the counter circuit 211 switches to the latch circuit, and the latch circuit latches a time code. With this configuration, the counter circuit 211 and the latch circuit are used in combination, and thus a circuit scale can be reduced.

The comparison circuit 225 compares an input timing of a control signal CTIME0 or CTIME1, and a timing at which a count value of the counter circuit 211 has reached the saturation value.

The control signals CTIME0 and CTIME1 are supplied from the control pulse generation circuit 115 via the vertical scanning circuit 110 and a control line 230 or 231, and a notification indicating the timing at which a count value of the counter circuit 211 has reached the saturation value is transmitted from the threshold value count detection circuit 224. Either the control signal CTIME0 or CTIME1 to be compared is selected by the selection circuit 226. The comparison circuit 225 compares an input timing of the control signal CTIME selected by the selection circuit 226 and the timing at which a count value of the counter circuit 211 has reached the saturation value, and notifies the frequency divider circuit 221, the counter circuit 211, and the selection circuit 226 of an earlier timing. In a case where a count value of the counter circuit 211 does not reach the saturation value, no notification is transmitted from the threshold value count detection circuit 224. The comparison circuit 225 determines that the input timing of the control signal CTIME selected by the selection circuit 226 is earlier than the timing at which a count value of the counter circuit 211 has reached the saturation value.

The illuminance determination circuit 223 determines an illuminance in accordance with a comparison result obtained by the comparison circuit 225. In a case where the timing at which a count value of the counter circuit 211 has reached the saturation value is earlier than the input timing of the control signal CTIME selected by the selection circuit 226, the illuminance determination circuit 223 determines that an illuminance is a high illuminance. In a case where the timing at which a count value of the counter circuit 211 has reached the saturation value is later than the input timing of the control signal CTIME selected by the selection circuit 226, the illuminance determination circuit 223 determines that an illuminance is a low illuminance.

In accordance with a notification indicating a comparison result that has been transmitted from the comparison circuit 225, the frequency divider circuit 221 divides the frequency of the control signal P_CLK supplied from the signal generation circuit 215 via the vertical scanning circuit 110 and a drive line 232. In a case where the illuminance determination circuit 223 determines that an illuminance is a low illuminance, based on the comparison result obtained by the comparison circuit 225, the frequency divider circuit 221 does not divide the frequency of the control signal P_CLK. In a case where the illuminance determination circuit 223 determines that an illuminance is a high illuminance, the frequency divider circuit 221 divides the frequency of the control signal P_CLK into a half frequency, and supplies the control signal P_CLK to the photon pulse generation circuit 220. A frequency division ratio is only required to be designed using a value desirable from the aspect of a system. The frequency of the control signal P_CLK can be divided into a one-fourth frequency or a one-eighth frequency, or a plurality of frequency division ratios can also be provided. In the first exemplary embodiment, the comparison circuit 225 stores the comparison result into a buffer or the like, and a frequency division ratio is switched at a timing at which the control pulse pRES is supplied to the frequency divider circuit 221 at the beginning of the next frame. However, the configuration is not limited to this. For example, a frequency division ratio can be switched in real time at some point in a frame.

In accordance with a notification indicating a comparison result that has been transmitted from the comparison circuit 225, the selection circuit 226 selects either the control signal CTIME0 or CTIME1 supplied from the control pulse generation circuit 115 via the vertical scanning circuit 110 and the control line 230 or 231. In the first exemplary embodiment, the control signal CTIME0 is used as a control signal for a low illuminance, and the control signal CTIME1 is used as a control signal for a high illuminance. In a case where the illuminance determination circuit 223 determines that an illuminance is a low illuminance, the selection circuit 226 selects the control signal CTIME0 based on the comparison result obtained by the comparison circuit 225, and supplies the control signal CTIME0 to the comparison circuit 225. Similarly, in a case where the illuminance determination circuit 223 determines that an illuminance is a high illuminance, the selection circuit 226 selects the control signal CTIME1 based on the comparison result obtained by the comparison circuit 225, and supplies the control signal CTIME1 to the comparison circuit 225. In the first exemplary embodiment, the comparison circuit 225 stores the comparison result into a buffer or the like, and the control signal CTIME is switched at a timing at which the control pulse pRES is supplied to the selection circuit 226 at the beginning of the next frame. However, the configuration is not limited to this. For example, the control signal CTIME can be switched in real time at some point in a frame.

If the selector 227 is notified by the threshold value count detection circuit 224 that a count value of the counter circuit 211 has reached the saturation value within a period of one frame, the selector 227 selects an output from the time counter circuit 222, and supplies the output to the selection circuit 212. If the selector 227 is not notified by the threshold value count detection circuit 224 that a count value of the counter circuit 211 has reached the saturation value within a period of one frame, the selector 227 selects an output from the counter circuit 211, and supplies the output to the selection circuit 212.

In accordance with the control pulse pSEL supplied from the control pulse generation circuit 115 via the vertical scanning circuit 110 and the drive line 214, the selection circuit 212 switches electric connection and separation between the selector 227 and the signal line 113. The selection circuit 212 includes a buffer circuit for outputting a signal, for example.

Figure 7A:
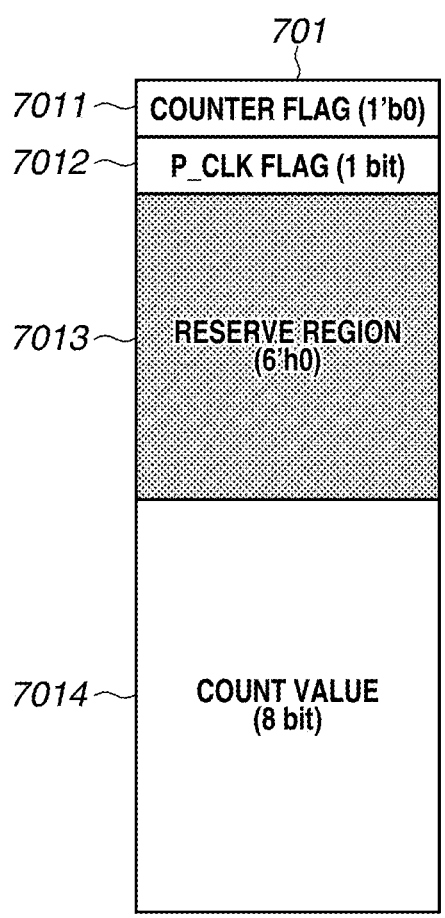
FIGS. 7A and 7B illustrate output formats of a counter circuit and a time counter circuit according to the first exemplary embodiment.
Figure 7B:
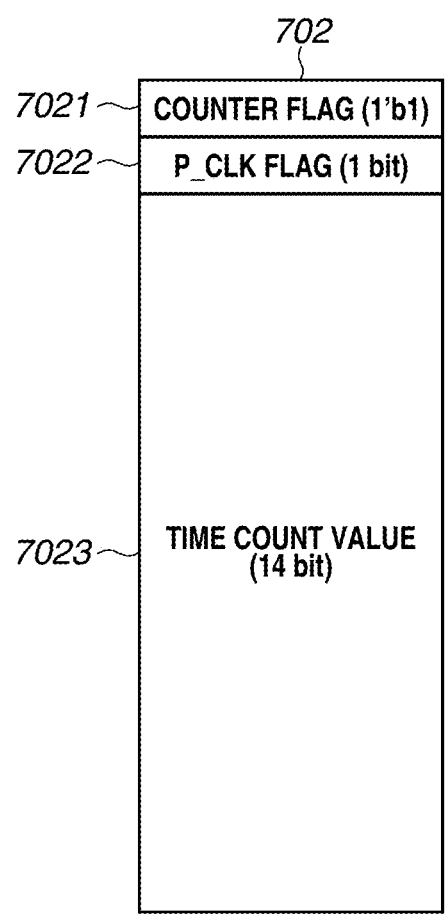

FIGS. 7A and 7B are diagrams illustrating output formats of the counter circuit 211 and the time counter circuit 222 according to the first exemplary embodiment. FIG. 7A illustrates an output format 701 of the counter circuit 211, and FIG. 7B illustrates an output format 702 of the time counter circuit 222.

At a most significant bit of the output format 701 of the counter circuit 211, a counter flag 7011 is provided. The counter flag 7011 indicates whether corresponding data is an output from the counter circuit 211 or an output from the time counter circuit 222 in subsequent processing (not illustrated). In the first exemplary embodiment, 0 indicates the counter circuit 211 and 1 indicates the time counter circuit 222. In the counter flag 7011, 0 is stored.

In the output format 701 of the counter circuit 211, a P_CLK flag 7012 is provided. The P_CLK flag 7012 indicates whether the frequency of the control signal P_CLK has been divided into a half frequency, for subsequent processing (not illustrated). In the first exemplary embodiment, 0 indicates an undivided frequency and 1 indicates a half-divided frequency. In the P_CLK flag 7012, a value of either 0 or 1 is stored. A frequency division ratio is only required to be designed using a value desirable from the aspect of a system. The frequency of the control signal P_CLK can be divided into a one-fourth frequency or a one-eighth frequency. In addition, a plurality of frequency division ratios can be provided by expanding the P_CLK flag 7012 to a plurality of bits.

To uniformize output bus widths of the counter circuit 211 and the time counter circuit 222 to 16 bits, a six-bit reserve region 7013 is provided in the output format 701 of the counter circuit 211. In the first exemplary embodiment, 0 is stored in the reserve region 7013.

At lower eight bits of the output format 701 of the counter circuit 211, a region 7014 storing a count value is provided.

The counter circuit 211 adds fixed values to the counter flag 7011 and the reserve region 7013. In a case where the illuminance determination circuit 223 determines that an illuminance is a low illuminance, based on the comparison result obtained by the comparison circuit 225, the counter circuit 211 further sets the P_CLK flag 7012 to 0. In a case where the illuminance determination circuit 223 determines that an illuminance is a high illuminance, the counter circuit 211 sets the P_CLK flag 7012 to 1. The output format 701 of the counter circuit 211 is formed in this manner.

In the first exemplary embodiment, the comparison circuit 225 stores the comparison result into a buffer or the like, and a frequency division ratio is switched at a timing at which the control pulse pRES is supplied to the frequency divider circuit 221 at the beginning of the next frame. However, the configuration is not limited to this. For example, a frequency division ratio can be switched in real time at some point in a frame. In this case, a flag indicating that a frequency division ratio has been switched at some point in a frame, and information indicating a time at which the frequency division ratio has been switched are added to the output format 701 of the counter circuit 211.

At a most significant bit of the output format 702 of the time counter circuit 222, a counter flag 7021 is provided indicating whether corresponding data is an output from the counter circuit 211 or an output from the time counter circuit 222 in subsequent processing (not illustrated). In the first exemplary embodiment, 0 indicates the counter circuit 211 and 1 indicates the time counter circuit 222. In the counter flag 7021, 1 is stored.

In the output format 702 of the time counter circuit 222, a P_CLK flag 7022 is provided. The P_CLK flag 7022 indicates whether the frequency of the control signal P_CLK has been divided into a half frequency, for subsequent processing (not illustrated). In the first exemplary embodiment, 0 indicates an undivided frequency and 1 indicates a half-divided frequency. In the P_CLK flag 7022, a value of either 0 or 1 is stored. A frequency division ratio is only required to be designed using a value desirable from the aspect of a system. The frequency of the control signal P_CLK can be divided into a one-fourth frequency or a one-eighth frequency. A plurality of frequency division ratios can also be provided by expanding the P_CLK flag 7022 to a plurality of bits.

At lower 14 bits of the output format 702 of the time counter circuit 222, a region 7023 storing a time count value is provided.

The time counter circuit 222 sets the counter flag 7021 to a fixed value. In a case where the illuminance determination circuit 223 determines that an illuminance is a low illuminance based on the comparison result obtained by the comparison circuit 225, the time counter circuit 222 further sets the P_CLK flag 7022 to 0. In a case where the illuminance determination circuit 223 determines that an illuminance is a high illuminance, the time counter circuit 222 sets the P_CLK flag 7022 to 1. The output format 702 of the time counter circuit 222 is formed in this manner.

In the first exemplary embodiment, the comparison circuit 225 stores the comparison result into a buffer or the like, and switches a frequency division ratio at a timing at which the control pulse pRES is supplied to the frequency divider circuit 221 at the beginning of the next frame. However, the configuration is not limited to this. For example, a frequency division ratio can be switched in real time at some point in a frame. In this case, a flag indicating that a frequency division ratio has been switched at some point in a frame, and information indicating a time at which the frequency division ratio has been switched are added to the output format 702 of the time counter circuit 222.

The subsequent processing (not illustrated) refers to the counter flag 7011 and the counter flag 7021 of received data. If each counter flag indicates 0, the subsequent processing recognizes that the received data is an output from the counter circuit 211. If each counter flag indicates 1, the subsequent processing (not illustrated) recognizes that the received data is an output from the time counter circuit 222.

In a case where the received data is an output from the counter circuit 211, the subsequent processing (not illustrated) further refers to the P_CLK flag 7012, and corrects a count value stored in the region 7014, in accordance with a value indicated by the P_CLK flag 7012. In a case where the P_CLK flag 7012 indicates 0, the frequency of the control signal P_CLK has been undivided, and the count value stored in the region 7014 is treated as the number of photons per frame without being corrected. In a case where the P_CLK flag 7012 indicates 1, the frequency of the control signal P_CLK has been divided into a half frequency, and the count value stored in the region 7014 is doubled and the resultant value is treated as the number of photons per frame. In a case where the frequency of the control signal P_CLK has been divided into a half frequency, the count value stored in the region 7014 is corrected by doubling the count value because a count speed of the counter circuit 211 becomes ½ even at the illuminance as compared with a case where the frequency of the control signal P_CLK has been undivided.

In a case where the received data is an output from the time counter circuit 222, the subsequent processing (not illustrated) further refers to the P_CLK flag 7022, and calculates the number of photons per frame based on a time count value stored in the region 7023, in accordance with a value indicated by the P_CLK flag 7022. In a case where the P_CLK flag 7022 indicates 0, the frequency of the control signal P_CLK has been undivided. In this case, using the following formula, the number of photons CNT per frame is calculated from a saturation value S of the counter circuit 211, a count value FT counted by the time counter circuit 222 in a one-frame period, and a count value ST counted by the time counter circuit 222 until the time count value reaches the saturation value S.

$$CNT = S \times FT/ST \tag{1}$$

In contrast, in a case where the P_CLK flag 7022 indicates 1, the frequency of the control signal P_CLK has been divided into a half frequency. In this case, using the following formula, the number of photons CNT per frame is calculated from the saturation value S of the counter circuit 211, the count value FT counted by the time counter circuit 222 in a one-frame period, and the count value ST counted by the time counter circuit 222 until the time count value reaches the saturation value S.

$$CNT = S \times FT/(ST/2) \tag{2}$$

In a case where the frequency of the control signal P_CLK has been divided into a half frequency, the count value ST indicating a time until the time count value reaches the saturation value S is corrected by halving the count value ST because a doubled time is taken until the count value reaches the saturation value S even at the illuminance as compared with a case where the frequency of the control signal P_CLK has been undivided.

FIG. 8 is a timing chart illustrating an operation of the signal processing circuit 103 according to the first exemplary embodiment.

At a time T0, a first frame is started.

At a time T1, the control pulse pRES is supplied from the control pulse generation circuit 115 via the vertical scanning circuit 110 and the drive line 213, and count values of the counter circuit 211 and the time counter circuit 222 are reset. As count values of the counter circuit 211 and the time counter circuit 222, 0 is set.

At a time T2, the drive signal CNTEN supplied from the control pulse generation circuit 115 via the vertical scanning circuit 110 and the drive line 228 rises up, and the counting of the counter circuit 211 and the time counter circuit 222 (i.e., exposure) is started. In the first frame, the frequency divider circuit 221 supplies the control signal P_CLK to the photon pulse generation circuit 220 without dividing the frequency thereof.

At a time T3, a count value of the counter circuit 211 reaches a saturation value, and the threshold value count detection circuit 224 detects saturation. The time counter circuit 222 is notified by the threshold value count detection circuit 224 that a count value of the counter circuit 211 has reached the saturation value, and stops counting.

At a time T4, the control signal CTIME0 selected by the selection circuit 226 is supplied to the comparison circuit 225. Because the threshold value count detection circuit 224 has detected saturation at the time point, the timing at which a count value of the counter circuit 211 has reached the saturation value is earlier than an input timing of the control signal CTIME0, and the illuminance determination circuit 223 determines that an illuminance in the first frame is a high illuminance. In a case where the illuminance determination circuit 223 determines that an illuminance is a high illuminance based on the comparison result obtained by the comparison circuit 225, the frequency divider circuit 221 divides the frequency of the control signal P_CLK into a half frequency. In a case where the illuminance determination circuit 223 determines that an illuminance is a high illuminance based on the comparison result obtained by the comparison circuit 225, the selection circuit 226 selects the control signal CTIME1.

In a case where the illuminance determination circuit 223 determines that an illuminance is a high illuminance, the frequency divider circuit 221 divides the frequency of the control signal P_CLK into a half frequency in the next frame, and the selection circuit 226 selects the control signal CTIME1. In contrast, in a case where the illuminance determination circuit 223 determines that an illuminance is a low illuminance, the frequency divider circuit 221 does not divide the frequency of the control signal P_CLK in the next frame, and the selection circuit 226 selects the control signal CTIME0. In a case where the frequency divider circuit 221 has divided the frequency of the control signal P_CLK into a half frequency, a count speed of the counter circuit 211 becomes ½ even at the same illuminance. Accordingly, a period during which a control signal CTIME indicating a timing at which the comparison circuit 225 performs comparison is input is also to be extended to a doubled period. For example, when a time from the rising edge of the drive signal CNTEN to the trailing edge of the control signal CTIME0 is denoted by CmpT, a time from the rising edge of the drive signal CNTEN to the trailing edge of the control signal CTIME1 is set to 2×CmpT.

In the first exemplary embodiment, the comparison circuit 225 stores the comparison result into a buffer or the like, and a frequency division ratio is switched at a timing at which the control pulse pRES is supplied to the frequency divider circuit 221 at the beginning of the next frame. Thus, the control signal P_CLK of which the frequency has been divided into a half frequency is actually used from a second frame. Nevertheless, a frequency division ratio can be switched in real time at some point in the first frame.

At a time T5, the drive signal CNTEN supplied from the control pulse generation circuit 115 via the vertical scanning circuit 110 and the drive line 228 falls, exposure ends, and the processing transitions to readout. That is, a period from the time T2 to time T5 corresponds to an exposure period of the first frame.

At a time T6, the control pulse pSEL is supplied to the selection circuit 212 from the control pulse generation circuit 115 via the vertical scanning circuit 110 and the drive line 214. At this time point, the threshold value count detection circuit 224 has detected the saturation of a count value of the counter circuit 211. The output format 702 of the time counter circuit 222 that has been selected by the selector 227 is consequently output to the signal line 113.

At a time T7, the first frame ends, and the second frame is started.

At a time T8, the control pulse pRES is supplied from the control pulse generation circuit 115 via the vertical scanning circuit 110 and the drive line 213, and count values of the counter circuit 211 and the time counter circuit 222 are reset. As count values of the counter circuit 211 and the time counter circuit 222, 0 is set. In addition, an illuminance determination result (high illuminance) of the first frame is set in the frequency divider circuit 221, and the frequency divider circuit 221 divides the frequency of the control signal P_CLK into a half frequency, and outputs the control signal P_CLK. The comparison result obtained by the comparison circuit 225 and the detection result obtained by the threshold value count detection circuit 224 are cleared.

At a time T9, the drive signal CNTEN supplied from the control pulse generation circuit 115 via the vertical scanning circuit 110 and the drive line 228 rises up, and the counting of the counter circuit 211 and the time counter circuit 222 (i.e., exposure) is started. Because the illuminance determination circuit 223 has determined that an illuminance in the first frame is a high illuminance, the frequency divider circuit 221 divides the frequency of the control signal P_CLK into a half frequency in the second frame, and supplies the control signal P_CLK to the photon pulse generation circuit 220.

At a time T10, the control signal CTIME1 selected by the selection circuit 226 is supplied to the comparison circuit 225. At the time point, the threshold value count detection circuit 224 has not detected saturation of a count value of the counter circuit 211. The timing at which a count value of the counter circuit 211 has reached the saturation value is later than an input timing of the control signal CTIME1, and the illuminance determination circuit 223 determines that an illuminance in the second frame is a low illuminance. In a case where the illuminance determination circuit 223 determines that an illuminance is a low illuminance, the frequency divider circuit 221 does not divide the frequency of the control signal P_CLK, based on the comparison result obtained by the comparison circuit 225.

In a case where the illuminance determination circuit 223 determines that an illuminance is a low illuminance based on the comparison result obtained by the comparison circuit 225, the selection circuit 226 selects the control signal CTIME0.

In the first exemplary embodiment, the comparison circuit 225 stores the comparison result into a buffer or the like, and a frequency division ratio is switched at a timing at which the control pulse pRES is supplied to the frequency divider circuit 221 at the beginning of the next frame. Thus, the control signal P_CLK of which the frequency has been divided into a half frequency is actually used from a third frame. Nevertheless, a frequency division ratio can be switched in real time at some point in the second frame.

At a time T11, a count value of the counter circuit 211 reaches a saturation value, and the threshold value count detection circuit 224 detects saturation. The time counter circuit 222 is notified by the threshold value count detection circuit 224 that a count value of the counter circuit 211 has reached the saturation value, and stops counting.

At a time T12, the drive signal CNTEN supplied from the control pulse generation circuit 115 via the vertical scanning circuit 110 and the drive line 228 falls, exposure ends, and the processing transitions to readout. That is, a period from the time T9 to time T12 corresponds to an exposure period of the second frame.

At a time T13, the control pulse pSEL is supplied to the selection circuit 212 from the control pulse generation circuit 115 via the vertical scanning circuit 110 and the drive line 214. At the time point, the threshold value count detection circuit 224 has detected saturation of a count value of the counter circuit 211. The output format 702 of the time counter circuit 222 that has been selected by the selector 227 is consequently output to the signal line 113.

At a time T14, the second frame ends, and the third frame is started.

At a time T15, the control pulse pRES is supplied from the control pulse generation circuit 115 via the vertical scanning circuit 110 and the drive line 213, and count values of the counter circuit 211 and the time counter circuit 222 are reset. As count values of the counter circuit 211 and the time counter circuit 222, 0 is set. In addition, an illuminance determination result (low illuminance) of the second frame is set in the frequency divider circuit 221, and the frequency divider circuit 221 outputs the control signal P_CLK without dividing the frequency thereof. The comparison result obtained by the comparison circuit 225 and the detection result obtained by the threshold value count detection circuit 224 are cleared.

At a time T16, the drive signal CNTEN supplied from the control pulse generation circuit 115 via the vertical scanning circuit 110 and the drive line 228 rises up, and the counting of the counter circuit 211 and the time counter circuit 222 (i.e., exposure) is started. The frequency divider circuit 221 supplies the control signal P_CLK to the photon pulse generation circuit 220 without dividing the frequency thereof in the third frame because the illuminance determination circuit 223 has determined that an illuminance in the second frame is a low illuminance.

At a time T17, the control signal CTIME0 selected by the selection circuit 226 is supplied to the comparison circuit 225. At the time point, the threshold value count detection circuit 224 has not detected saturation of a count value of the counter circuit 211, and the illuminance determination circuit 223 determines that an illuminance in the third frame is a low illuminance. Based on the comparison result obtained by the comparison circuit 225, the frequency divider circuit 221 does not divide the frequency of the control signal P_CLK continuously from the second frame. The selection circuit 226 selects the control signal CTIME0 continuously from the second frame, based on the comparison result obtained by the comparison circuit 225.

At a time T18, the drive signal CNTEN supplied from the control pulse generation circuit 115 via the vertical scanning circuit 110 and the drive line 228 falls, the counter circuit 211 and the time counter circuit 222 stop counting, exposure ends, and the processing transitions to readout. That is, a period from the time T16 to time T18 corresponds to an exposure period of the third frame.

At a time T19, the control pulse pSEL is supplied to the selection circuit 212 from the control pulse generation circuit 115 via the vertical scanning circuit 110 and the drive line 214. At the time point, the threshold value count detection circuit 224 has not detected saturation of a count value of the counter circuit 211. The output format 701 of the counter circuit 211 that has been selected by the selector 227 is consequently output to the signal line 113.

At a time T20, the third frame ends.

Although the illuminance determination circuit 223 has determined that an illuminance in the first frame is a high illuminance, the frequency divider circuit 221 supplies the control signal P_CLK to the photon pulse generation circuit 220 without dividing the frequency thereof. In addition, although the illuminance determination circuit 223 has determined that an illuminance in the second frame is a low illuminance, the frequency divider circuit 221 divides the frequency of the control signal P_CLK into a half frequency, and supplies the control signal P_CLK to the photon pulse generation circuit 220. In the first exemplary embodiment, the comparison circuit 225 stores the comparison result into a buffer or the like, and a frequency division ratio is switched at a timing at which the control pulse pRES is supplied to the frequency divider circuit 221 at the beginning of the next frame. Thus, such a state is caused in switching from the low illuminance to the high illuminance, or from the high illuminance to the low illuminance. Nevertheless, frames with a low illuminance or a high illuminance tend to be consecutive on a probabilistic basis. If a frequency division ratio is switched in real time at some point in a frame, such a state is not caused.

In a case where the frequency divider circuit 221 has divided the frequency of the control signal P_CLK into a half frequency in a frame with a high illuminance, a count speed of the counter circuit 211 becomes ½ even at the same illuminance. A time until the threshold value count detection circuit 224 detects saturation becomes a doubled time as compared with a case where the frequency of the control signal P_CLK is undivided, accordingly.

In contrast, in a case where the frequency divider circuit 221 has divided the frequency of the control signal P_CLK into a half frequency in a frame with a high illuminance, a frequency of the recharge operation becomes ½ even at the same illuminance. As compared with a case where the frequency of the control signal P_CLK is undivided, a frequency at which a current (recharge current) corresponding to a voltage drop caused by the quench operation, and an avalanche current flow also becomes ½. With this configuration, in a case where the frequency divider circuit 221 has divided the frequency of the control signal P_CLK into a half frequency, as compared with a case where the frequency of the control signal P_CLK is undivided, power consumption can be leveled within a one-frame period.

Figure 9A:
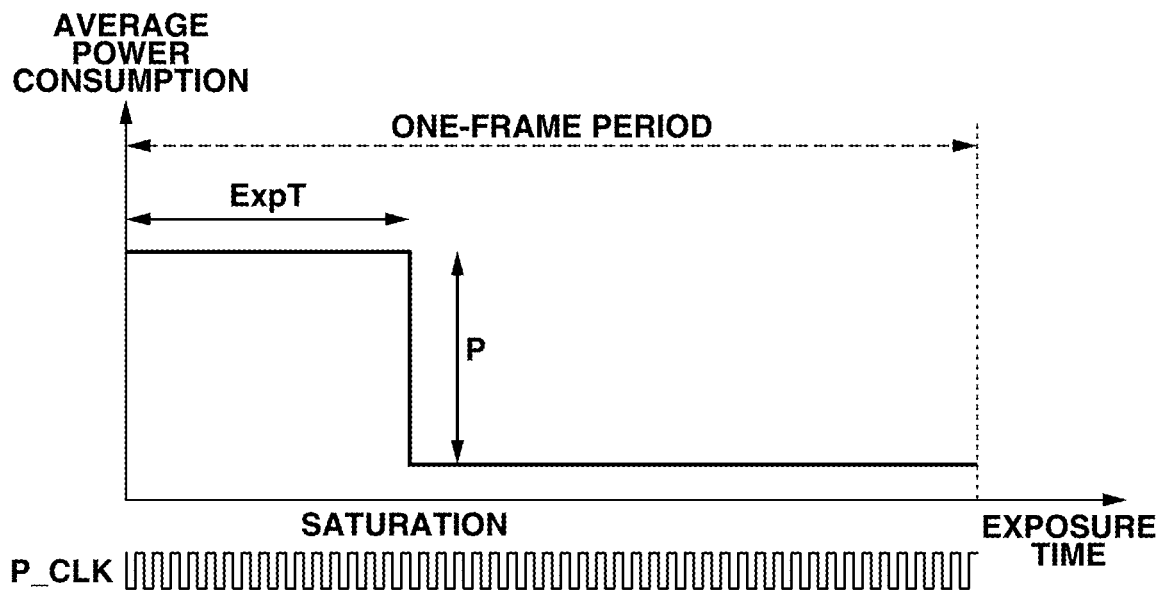
FIGS. 9A and 9B are image diagrams illustrating how power consumption is leveled.
Figure 9B:
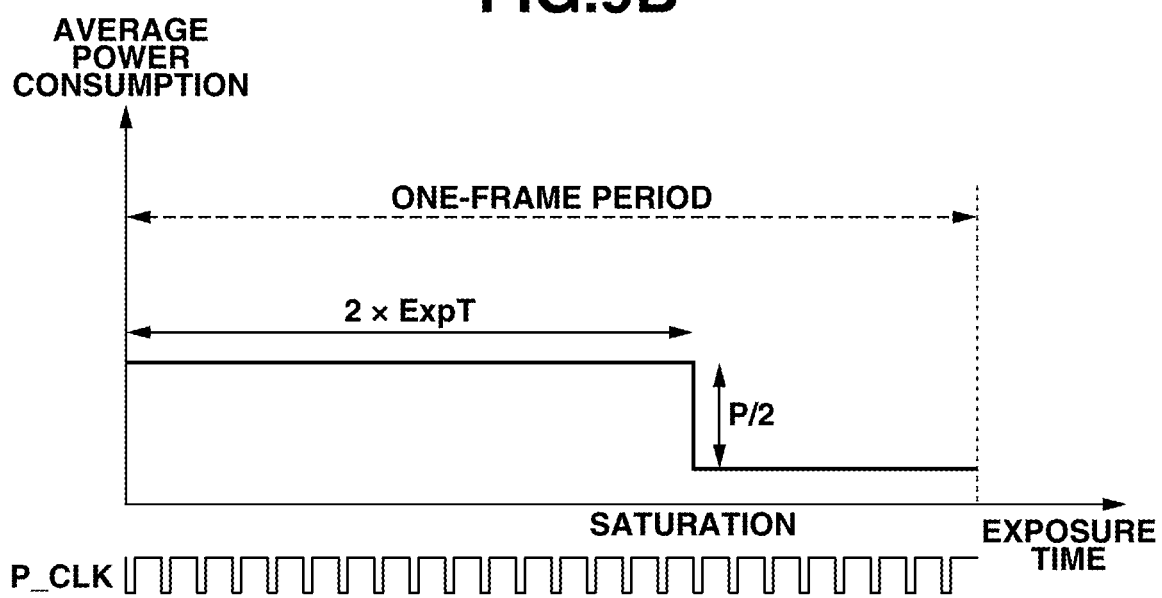

FIGS. 9A and 9B are image diagrams illustrating how power consumption is leveled within one frame.

FIG. 9A is a diagram illustrating an exposure time and average power consumption in a case where the first exemplary embodiment is not applied. In FIG. 9A, "ExpT" denotes an exposure period until a count value of the counter circuit 211 is saturated, and "P" denotes a rising height of average power consumption in the exposure period. Since the count value of the counter circuit 211 is saturated in an anterior half of a one-frame period, power consumption is one-sided toward the anterior half of the one-frame period.

FIG. 9B is a diagram illustrating an exposure time and average power consumption in a case where the first exemplary embodiment is applied, and the frequency divider circuit 221 has divided the frequency of the control signal P_CLK into a half frequency. An exposure period until a count value of the counter circuit 211 is saturated becomes 2×ExpT, and a rising height of average power consumption in the exposure period becomes 2/P. Since the count value of the counter circuit 211 is saturated in a posterior half of the one-frame period, power consumption is not one-sided toward the anterior half of the one-frame period. That is, it can be seen that the power consumption is leveled within one frame.

As described above, in the first exemplary embodiment, the frequency divider circuit 221 inputs a low-frequency control signal P_CLK by dividing the frequency of the control signal P_CLK in a frame with a high illuminance, and inputs a high-frequency control signal P_CLK in a frame with a low illuminance, and the power consumption can thereby be leveled within one frame.

Figure 10:
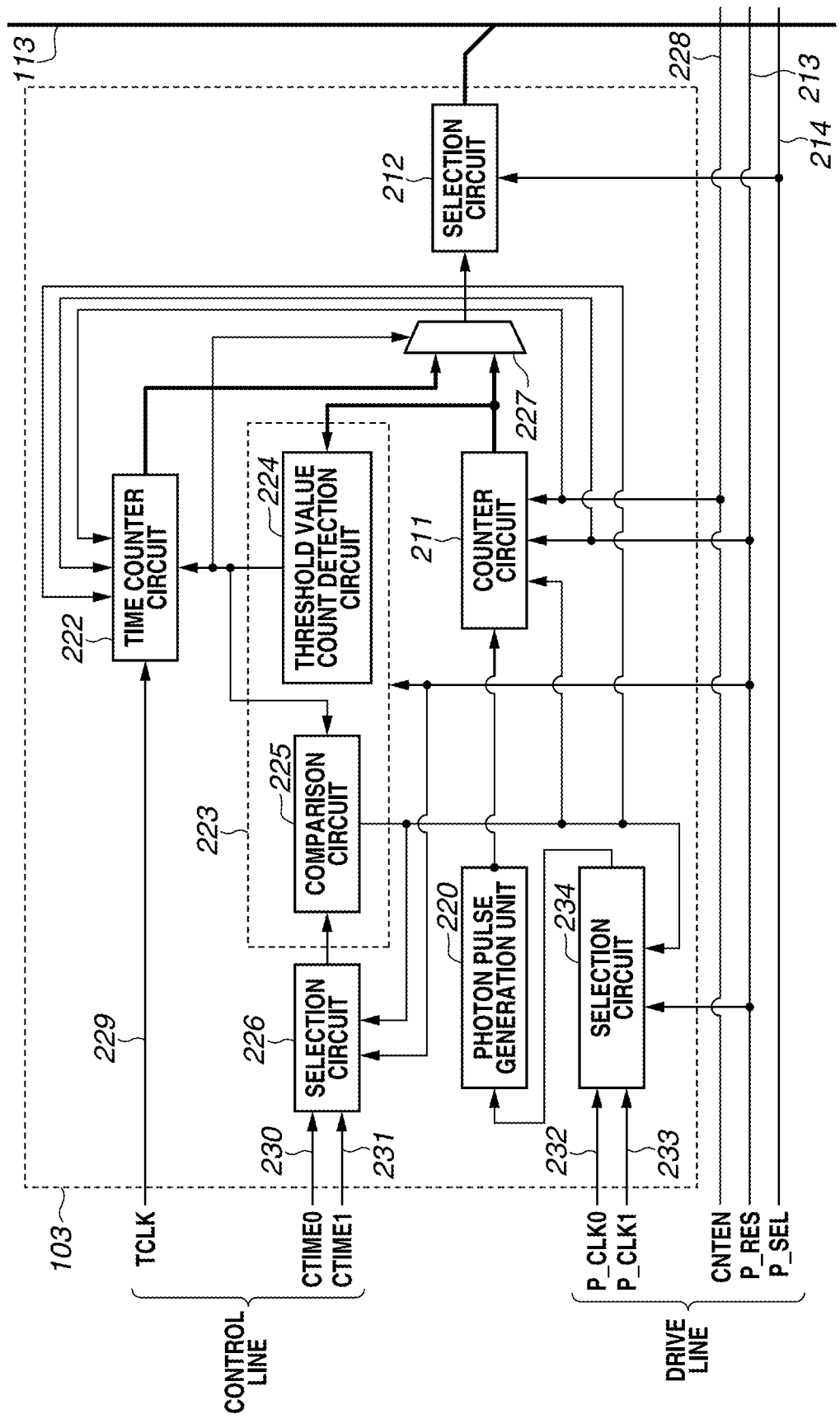
FIG. 10 is a block diagram illustrating a configuration example of a signal processing circuit according to a second exemplary embodiment.

FIG. 10 is a block diagram illustrating a configuration example of a signal processing circuit 103 according to the second exemplary embodiment.

A difference from the signal processing circuit 103 according to the first exemplary embodiment illustrated in FIG. 6 lies in that the frequency divider circuit 221 is replaced with a selection circuit 234.

In accordance with a notification indicating a comparison result that has been transmitted from the comparison circuit 225, the selection circuit 234 selects any of a plurality of control signals P_CLK0/1 supplied from the signal generation circuit 215 via the vertical scanning circuit 110 and a drive line 232 or 233. In a case where the illuminance determination circuit 223 determines that an illuminance is a low illuminance, based on the comparison result obtained by the comparison circuit 225, the selection circuit 234 selects a control signal P_CLK0. In a case where the illuminance determination circuit 223 determines that an illuminance is a high illuminance, the selection circuit 234 selects a control signal P_CLK1. The selected control signal P_CLK is supplied to the photon pulse generation circuit 220. The signal generation circuit 215 generates the control signal P_CLK0 corresponding to the control signal P_CLK in the first exemplary embodiment, and the control signal P_CLK1 having a half-divided frequency of the frequency of the control signal P_CLK0. A frequency division ratio is to be designed using a value desirable from the aspect of a system. The frequency of the control signal P_CLK can be divided into a one-fourth frequency or a one-eighth frequency. A plurality of frequency division ratios can also be provided. That is, the signal generation circuit 215 can output three or more types of control signals P_CLK. In the second exemplary embodiment, the comparison circuit 225 stores the comparison result into a buffer or the like, and the control signal P_CLK is switched at a timing at which the control pulse pRES is supplied to the selection circuit 234 at the beginning of the next frame. However, the configuration is not limited to this. For example, the control signal P_CLK can be switched in real time at some point in a frame.

Output formats of the counter circuit 211 and the time counter circuit 222 according to the second exemplary embodiment are similar to the output formats according to the first exemplary embodiment that are illustrated in FIGS. 7A and 7B.

A timing chart illustrating an operation of the signal processing circuit 103 according to the second exemplary embodiment is almost similar to the timing chart according to the first exemplary embodiment that is illustrated in FIG. 8. The timing chart according to the second exemplary embodiment differs from the timing chart illustrated in FIG. 8 in that the number of control signal lines through which the control signal P_CLK can be input to the signal processing circuit 103 is not one but two, and a frequency divider circuit output becomes a selection circuit output.

As described above, according to the second exemplary embodiment, power consumption can be leveled within one frame, by the selection circuit 234 selecting the control signal P_CLK1 of which the frequency has been divided into a half frequency of the frequency of the control signal P_CLK0, in a frame with a high illuminance.

A configuration example of a signal processing circuit 103 according to a third exemplary embodiment is similar to the configuration example according to the second exemplary embodiment that is illustrated in FIG. 10.

In accordance with a notification indicating a comparison result that has been transmitted from the comparison circuit 225, the selection circuit 234 selects any of a plurality of control signals P_CLK0/1 supplied from the signal generation circuit 215 via the vertical scanning circuit 110 and a drive line 232 or 233. In a case where the illuminance determination circuit 223 determines that an illuminance is a low illuminance based on the comparison result obtained by the comparison circuit 225, the selection circuit 234 selects the control signal P_CLK0. In a case where the illuminance determination circuit 223 determines that an illuminance is a high illuminance, the selection circuit 234 selects the control signal P_CLK1. The selected control signal P_CLK is supplied to the photon pulse generation circuit 220. The signal generation circuit 215 generates the control signal P_CLK0 oscillating in the entire period of one-frame, and the control signal P_CLK1 oscillating from a middle point or after the middle point in a one-frame period.

Output formats of the counter circuit 211 and the time counter circuit 222 according to the third exemplary embodiment are similar to the output formats according to the first exemplary embodiment that are illustrated in FIGS. 7A and 7B. However, a field with different meaning exists, and thus, a difference will be described.

In the output format 701 of the counter circuit 211, a P_CLK flag 7012 is provided. The P_CLK flag 7012 indicates whether the control signal P_CLK0 oscillating in the entire period of one-frame has been selected, or the control signal P_CLK1 oscillating from a middle point or after the middle point in a one-frame period has been selected, in the subsequent processing (not illustrated). In the third exemplary embodiment, 0 indicates the control signal P_CLK0 and 1 indicates the control signal P_CLK1, and a value of either 0 or 1 is stored in the P_CLK flag 7012.

In the output format 702 of the time counter circuit 222, a P_CLK flag 7022 is provided. The P_CLK flag 7022 indicates whether the control signal P_CLK0 oscillating in the entire period of one-frame has been selected, or the control signal P_CLK1 oscillating from a middle point or some point following the middle point in a one-frame period has been selected, in the subsequent processing (not illustrated). In the third exemplary embodiment, 0 indicates the control signal P_CLK0 and 1 indicates the control signal P_CLK1, and a value of either 0 or 1 is stored in the P_CLK flag 7022.

The subsequent processing (not illustrated) refers to the counter flag 7011 and the counter flag 7021 of received data. The subsequent processing (not illustrated) recognizes that the received data is an output from the counter circuit 211 if each counter flag indicates 0, and recognizes that the received data is an output from the time counter circuit 222 if each counter flag indicates 1.

In a case where the received data is an output from the counter circuit 211, the subsequent processing (not illustrated) further refers to the P_CLK flag 7012, and corrects a count value stored in the region 7014 in accordance with a value indicated by the P_CLK flag 7012. In a case where the P_CLK flag 7012 indicates 0, the control signal P_CLK is the control signal P_CLK0 oscillating in the entire one-frame period, and the count value stored in the region 7014 is treated as the number of photons per frame without being corrected. In a case where the P_CLK flag 7012 indicates 1, the control signal P_CLK is the control signal P_CLK1 oscillating from a middle point or after the middle point in a one-frame period. If an oscillation start of the control signal P_CLK1 is a time point at which ½ of the exposure period has elapsed, the count value stored in the region 7014 is doubled and the resultant value is treated as the number of photons per frame. This is because a count period of the counter circuit 211 becomes ½ even at the same illuminance. The oscillation start of the control signal P_CLK1 is to be a middle point or after the middle point in a one-frame period, and is not limited to the time point at which ½ of the exposure period has elapsed.

In a case where the received data is an output from the time counter circuit 222, the subsequent processing (not illustrated) further refers to the P_CLK flag 7022, and calculates the number of photons per frame based on a time count value stored in the region 7023, in accordance with a value indicated by the P_CLK flag 7022. In a case where the P_CLK flag 7022 indicates 0, the control signal P_CLK is the control signal P_CLK0 oscillating in the entire period of one-frame. In this case, the number of photons CNT per frame is calculated from the saturation value S of the counter circuit 211, the count value FT counted by the time counter circuit 222 in a one-frame period, and the count value ST counted by the time counter circuit 222 until the time count value reaches the saturation value S, according to Formula 1 described above.

In contrast, in a case where the P_CLK flag 7022 indicates 1, the control signal P_CLK is the control signal P_CLK1 oscillating from a middle point or after the middle point in a one-frame period. In this case, if an oscillation start of the control signal P_CLK1 is a time point at which ½ of the exposure period has elapsed, the number of photons CNT per frame is calculated according to the formula described below. The number of photons CNT per frame is calculated from the saturation value S of the counter circuit 211, the count value FT counted by the time counter circuit 222 in a one-frame period, and the count value ST counted by the time counter circuit 222 until the time count value reaches the saturation value S.

$$CNT=S\times FT/(ST-(FT/2)) \qquad (3)$$

Because an oscillation start of the control signal P_CLK1 is the time point at which ½ of the exposure period has elapsed, the count value (ST) counted by the time counter circuit 222 until the time count value reaches the saturation value S includes a non-count time (FT/2) of a ½-frame period. Thus, a time corresponding to the non-count time is subtracted. The oscillation start of the control signal P_CLK1 is to be a middle point or after the middle point in a one-frame period, and is not limited to the time point at which ½ of the exposure period has elapsed.

FIG. 11 is a timing chart illustrating an operation of the signal processing circuit 103 according to the third exemplary embodiment.

At a time T0, a first frame is started.

At a time T1, the control pulse pRES is supplied from the control pulse generation circuit 115 via the vertical scanning circuit 110 and the drive line 213, and count values of the counter circuit 211 and the time counter circuit 222 are reset. As count values of the counter circuit 211 and the time counter circuit 222, 0 is set.

At a time T2, the drive signal CNTEN supplied from the control pulse generation circuit 115 via the vertical scanning circuit 110 and the drive line 228 rises up, and the counting of the counter circuit 211 and the time counter circuit 222 (i.e., exposure) is started. In the first frame, the selection circuit 234 selects the control signal P_CLK0 oscillating in the entire period of one-frame, and supplies the control signal P_CLK0 to the photon pulse generation circuit 220.

At a time T3, a count value of the counter circuit 211 reaches a saturation value, and the threshold value count detection circuit 224 detects saturation. The time counter circuit 222 is notified by the threshold value count detection circuit 224 that a count value of the counter circuit 211 has reached the saturation value, and stops counting.

At a time T4, the control signal CTIME0 selected by the selection circuit 226 is supplied to the comparison circuit 225. At the time point, the threshold value count detection circuit 224 has detected saturation of a count value of the counter circuit 211. The timing at which a count value of the counter circuit 211 has reached the saturation value is earlier than an input timing of the control signal CTIME0, and the illuminance determination circuit 223 determines that an illuminance in the first frame is a high illuminance. In a case where the illuminance determination circuit 223 determines that an illuminance is a high illuminance, based on the comparison result obtained by the comparison circuit 225, the selection circuit 234 selects the control signal P_CLK1 oscillating from a middle point or after the middle point in a one-frame period. In a case where the illuminance determination circuit 223 determines that an illuminance is a high illuminance based on the comparison result obtained by the comparison circuit 225, the selection circuit 226 selects the control signal CTIME1.

At a time T5, the control signal P_CLK1 oscillating from a middle point or after the middle point in a one-frame period starts to oscillate.

In a case where the illuminance determination circuit 223 determines that an illuminance is a high illuminance, the selection circuit 234 selects, in the next frame, the control signal P_CLK1 oscillating from a middle point or after the middle point in a one-frame period, and the selection circuit 226 selects the control signal CTIME1. In contrast, in a case where the illuminance determination circuit 223 determines that an illuminance is a low illuminance, the selection circuit 234 selects, in the next frame, the control signal P_CLK0 oscillating in the entire period of one-frame, and the selection circuit 226 selects the control signal CTIME0. This is because an input timing of a control signal CTIME indicating a timing at which the comparison circuit 225 performs comparison is also to be differentiated because the control signal P_CLK0 and the control signal P_CLK1 are different in a count start time of the counter circuit 211.

As illustrated in FIG. 11, a time from the rising edge of the drive signal CNTEN to the trailing edge of the control signal CTIME0 and a time from an oscillation start of the control signal P_CLK1 to the trailing edge of the control signal CTIME1 are set to the same time CmpT.

In the third exemplary embodiment, the comparison circuit 225 stores the comparison result into a buffer or the like, and switches the control signal P_CLK at a timing at which the control pulse pRES is supplied to the selection circuit 234 at the beginning of the next frame. Thus, the control signal P_CLK1 oscillating from a middle point or after the middle point in a one-frame period is actually used from a second frame. Nevertheless, the control signal P_CLK can also be switched in real time at some point in the first frame.

At a time T6, the drive signal CNTEN supplied from the control pulse generation circuit 115 via the vertical scanning circuit 110 and the drive line 228 falls, exposure ends, and the processing transitions to readout. That is, a period from the time T2 to time T6 corresponds to an exposure period of the first frame.

At a time T7, the control pulse pSEL is supplied to the selection circuit 212 from the control pulse generation circuit 115 via the vertical scanning circuit 110 and the drive line 214. At the time point, the threshold value count detection circuit 224 has detected saturation of a count value of the counter circuit 211. The output format 702 of the time counter circuit 222 that has been selected by the selector 227 is consequently output to the signal line 113.

At a time T8, the first frame ends, and the second frame is started.

At a time T9, the control pulse pRES is supplied from the control pulse generation circuit 115 via the vertical scanning circuit 110 and the drive line 213, and count values of the counter circuit 211 and the time counter circuit 222 are reset. As count values of the counter circuit 211 and the time counter circuit 222, 0 is set. In addition, an illuminance determination result (high illuminance) of the first frame is set in the selection circuit 234, and the selection circuit 234 selects and outputs the control signal P_CLK1 oscillating from a middle point or after the middle point in a one-frame period. The comparison result obtained by the comparison circuit 225 and the detection result obtained by the threshold value count detection circuit 224 are then cleared.

At a time T10, the drive signal CNTEN supplied from the control pulse generation circuit 115 via the vertical scanning circuit 110 and the drive line 228 rises up, and the counting of the time counter circuit 222 is started. However, the illuminance determination circuit 223 has determined that an illuminance in the first frame is a high illuminance, and therefore the selection circuit 234 selects, in the second frame, the control signal P_CLK1 oscillating from a middle point or after the middle point in a one-frame period, and supplies the control signal P_CLK1 to the photon pulse generation circuit 220. The counting of the counter circuit 211 (i.e., exposure) is not started yet at the time T10, accordingly.

At a time T11, the control signal P_CLK1 oscillating from a middle point or after the middle point in a one-frame period starts to oscillate. The counting of the counter circuit 211 (i.e., exposure) is started, accordingly.

At a time T12, the control signal CTIME1 selected by the selection circuit 226 is supplied to the comparison circuit 225. At the time point, the threshold value count detection circuit 224 has not detected saturation of a count value of the counter circuit 211. The timing at which a count value of the counter circuit 211 has reached the saturation value is later than an input timing of the control signal CTIME1, and the illuminance determination circuit 223 determines that an illuminance in the second frame is a low illuminance. In a case where the illuminance determination circuit 223 determines that an illuminance is a low illuminance based on the comparison result obtained by the comparison circuit 225, the selection circuit 234 selects the control signal P_CLK0 oscillating in the entire period of one-frame. In a case where the illuminance determination circuit 223 determines that an illuminance is a low illuminance based on the comparison result obtained by the comparison circuit 225, the selection circuit 226 selects the control signal CTIME0.

In other words, a relative position in the above-described first frame of a timing at which oscillation of the control signal P_CLK is started in the first frame, and a relative position in the above-described second frame of a timing at which oscillation of the control signal P_CLK is started in the second frame are different. A relative position in each frame of a timing at which oscillation of the control signal P_CLK is started refers to a ratio with respect to each frame period of a period from a start of each frame period to an oscillation start of the control signal P_CLK. For example, even if a period from a frame start to a timing at which oscillation of the control signal P_CLK is started in each frame is the same in the first frame and the second frame, relative positions are different if the length of the first frame and the length of the second frame are different.

In the third exemplary embodiment, the comparison circuit 225 stores the comparison result into a buffer or the like, and the control signal P_CLK is switched at a timing at which the control pulse pRES is supplied to the selection circuit 234 at the beginning of the next frame. Thus, the control signal P_CLK0 oscillating in the entire period of one-frame is actually used from a third frame. Nevertheless, the control signal P_CLK can be switched in real time at some point in the second frame.

At a time T13, a count value of the counter circuit 211 reaches a saturation value, and the threshold value count detection circuit 224 detects saturation. The time counter circuit 222 is notified by the threshold value count detection circuit 224 that a count value of the counter circuit 211 has reached the saturation value, and stops counting.

At a time T14, the drive signal CNTEN supplied from the control pulse generation circuit 115 via the vertical scanning circuit 110 and the drive line 228 falls, exposure ends, and the processing transitions to readout. That is, a period from the time T11 to time T14 corresponds to an exposure period of the second frame.

At a time T15, the control pulse generation circuit 115 supplies the control pulse pSEL to the selection circuit 212 via the vertical scanning circuit 110 and the drive line 214. At the time point, the threshold value count detection circuit 224 has detected saturation of a count value of the counter circuit 211. The output format 702 of the time counter circuit 222 that has been selected by the selector 227 is consequently output to the signal line 113.

At a time T16, the second frame ends, and the third frame is started.

At a time T17, the control pulse pRES is supplied from the control pulse generation circuit 115 via the vertical scanning circuit 110 and the drive line 213, and count values of the counter circuit 211 and the time counter circuit 222 are reset. As count values of the counter circuit 211 and the time counter circuit 222, 0 is set. In addition, an illuminance determination result (low illuminance) of the first frame is set in the selection circuit 234, and the selection circuit 234 selects and outputs the control signal P_CLK0 oscillating in the entire period of one-frame. The comparison result obtained by the comparison circuit 225 and the detection result obtained by the threshold value count detection circuit 224 are then cleared.

At a time T18, the drive signal CNTEN supplied from the control pulse generation circuit 115 via the vertical scanning circuit 110 and the drive line 228 rises up, and the counting of the counter circuit 211 and the time counter circuit 222 (i.e., exposure) is started. Since the illuminance determination circuit 223 has determined that an illuminance in the second frame is a low illuminance, the selection circuit 234 selects the control signal P_CLK0 oscillating in the entire period of one-frame in the third frame, and supplies the control signal P_CLK0 to the photon pulse generation circuit 220.

At a time T19, the control signal CTIME0 selected by the selection circuit 226 is supplied to the comparison circuit 225. At the time point, the threshold value count detection circuit 224 has not detected saturation of a count value of the counter circuit 211, and the illuminance determination circuit 223 determines that an illuminance in the third frame is a low illuminance. The selection circuit 234 selects the control signal P_CLK0 oscillating in the entire period of one-frame continuously from the second frame, based on the comparison result obtained by the comparison circuit 225. The selection circuit 226 selects the control signal CTIME0 continuously from the second frame, based on the comparison result obtained by the comparison circuit 225.

At a time T20, the control signal P_CLK1 oscillating from a middle point or after the middle point in a one-frame period starts to oscillate.

At a time T21, the drive signal CNTEN supplied from the control pulse generation circuit 115 via the vertical scanning circuit 110 and the drive line 228 falls, the counter circuit 211 and the time counter circuit 222 stop counting, exposure ends, and the processing transitions to readout. That is, a period from the time T18 to time T21 corresponds to an exposure period of the third frame.

At a time T22, the control pulse pSEL is supplied to the selection circuit 212 from the control pulse generation circuit 115 via the vertical scanning circuit 110 and the drive line 214. At the time point, the threshold value count detection circuit 224 has not detected saturation of a count value of the counter circuit 211. The output format 701 of the counter circuit 211 that has been selected by the selector 227 is consequently output to the signal line 113.

At a time T23, the third frame ends.

Although the illuminance determination circuit 223 has determined that an illuminance in the first frame is a high illuminance, the selection circuit 234 selects the control signal P_CLK0 oscillating in the entire period of one-frame, and supplies the control signal P_CLK0 to the photon pulse generation circuit 220. Although the illuminance determination circuit 223 has determined that an illuminance in the second frame is a low illuminance, the selection circuit 234 selects the control signal P_CLK1 oscillating from a middle point or after the middle point in a one-frame period, and supplies the control signal P_CLK1 to the photon pulse generation circuit 220. In the third exemplary embodiment, the comparison circuit 225 stores the comparison result into a buffer or the like, and the control signal P_CLK is switched at a timing at which the control pulse pRES is supplied to the frequency divider circuit 221 at the beginning of the next frame. In switching from the low illuminance to the high illuminance or from the high illuminance to the low illuminance, such a state is caused. Nevertheless, frames with a low illuminance or a high illuminance tend to be consecutive on a probabilistic basis. If the control signal P_CLK is switched in real time at some point in a frame, such a state is not caused.

Figure 12A:
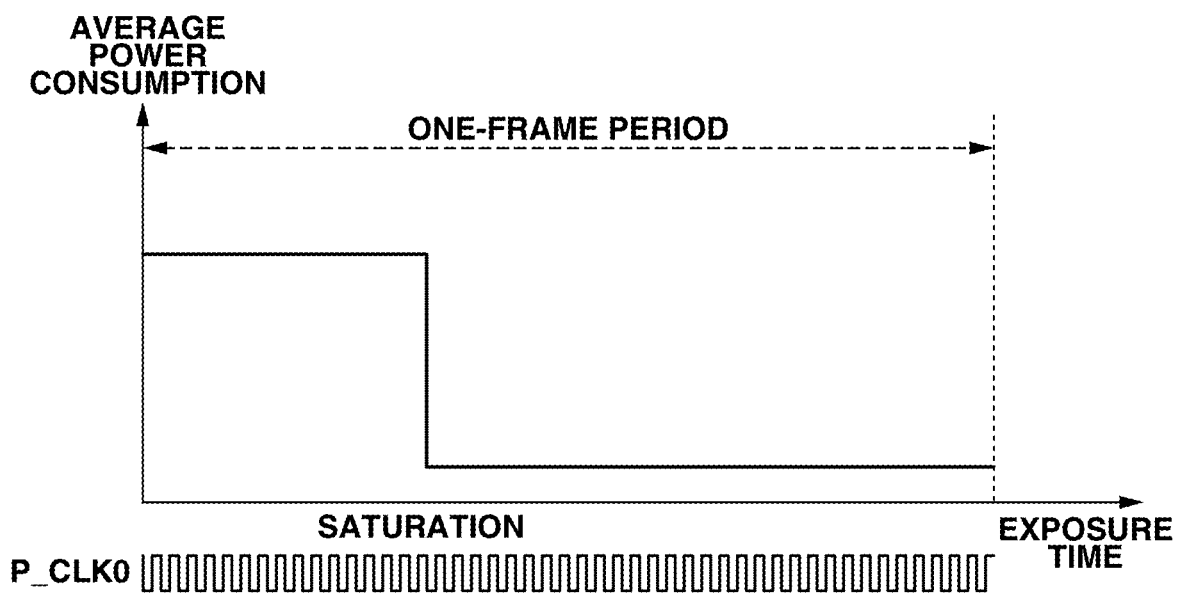
FIGS. 12A and 12B are image diagrams illustrating a control signal P_CLK0/1 and average power consumption.
Figure 12B:
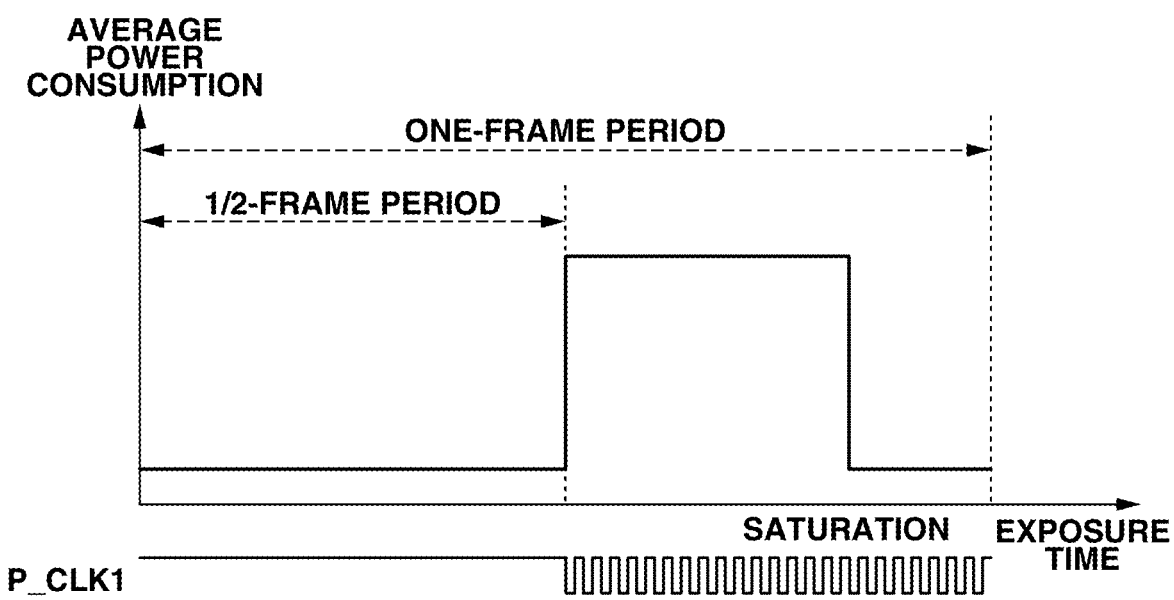

FIGS. 12A and 12B are image diagrams illustrating the control signal P_CLK0 and the control signal P_CLK1 in one frame, and their average power consumption.

FIG. 12A is a diagram illustrating an exposure time and average power consumption in a case where the control signal P_CLK0 is selected, and a count value of the counter circuit 211 is saturated in an anterior half of a one-frame period. Thus, power consumed by a recharge current and an avalanche current is one-sided toward the anterior half of the one-frame period.

FIG. 12B is a diagram illustrating an exposure time and average power consumption in a case where the control signal P_CLK1 is selected, and a count value of the counter circuit 211 is saturated in a posterior half of a one-frame period. Thus, power consumed by a recharge current and an avalanche current is one-sided toward the posterior half of the one-frame period.

In a case where the illuminance determination circuit 223 has determined that an illuminance is a high illuminance, power consumption of all pixels is one-sided toward the posterior half of the one-frame period if all pixels select the control signal P_CLK1, and power consumption cannot be leveled within one frame. In view of the foregoing, pixels are preliminarily classified into a pixel group in which the selection circuit 234 selects either the control signal P_CLK0 or the control signal P_CLK1, and a pixel group that always uses the control signal P_CLK0. By classifying 50% of all pixels into a pixel group in which the selection circuit 234 selects either the control signal P_CLK0 or the control signal P_CLK1 and the remaining 50% into a pixel group that always uses the control signal P_CLK0, it is possible to level power consumption within one frame.

A wide variety of methods can be used for pixel classification, such as classification for each row, classification for every plurality of rows, classification for each column, classification for every plurality of columns, classification into a checker board design, and random sorting, and a pixel classification method is not specifically limited. In addition, a pixel classification ratio is also not limited to the 50% case exemplified above.

As described above, the selection circuit 234 selects the control signal P_CLK1 oscillating only in a posterior half of a one-frame period for predetermined pixels in a frame with a high illuminance, according to the third exemplary embodiment. The remaining pixels use the control signal P_CLK0 corresponding to the control signal P_CLK in the first exemplary embodiment. With this configuration, power consumption can be leveled within one frame by mixedly including pixels of which power consumption is one-sided toward the anterior half of a one-frame period, and pixels of which power consumption is one-sided toward the posterior half of the one-frame period, in a screen.

In the first exemplary embodiment, a frequency division ratio of the control signal P_CLK can be switched for each pixel. In contrast to this, in a fourth exemplary embodiment, a frequency division ratio of the control signal P_CLK is switched for every plurality of pixels. For the sake of simplification of description, a frequency division ratio is switched for every four pixels. However, a frequency division ratio can be switched for every 16 pixels, for example, and the number of pixels is not limited to four.

Figure 13:
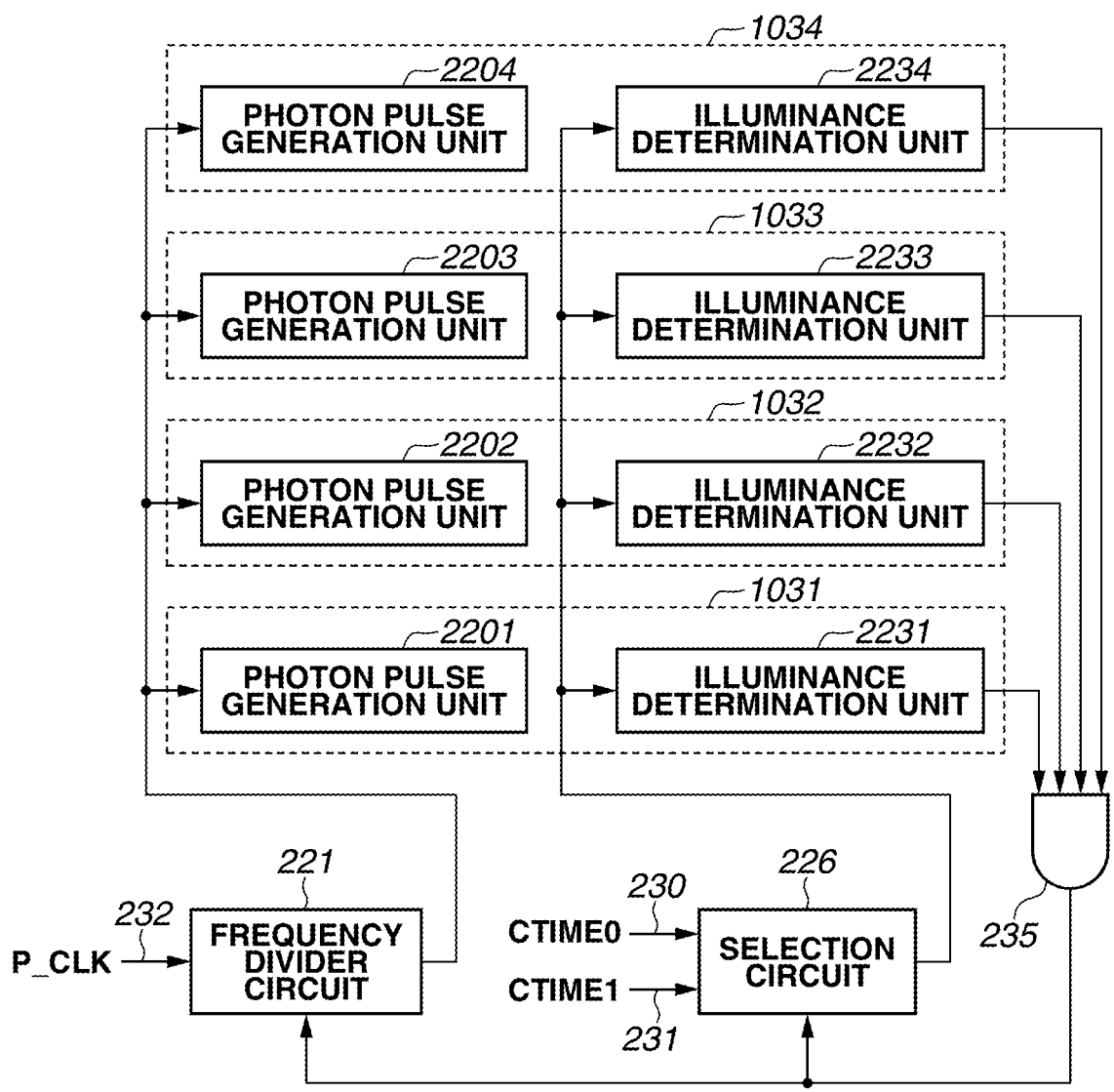
FIG. 13 is a schematic block diagram illustrating concept of a configuration example of a signal processing circuit according to a fourth exemplary embodiment.

FIG. 13 is a schematic diagram illustrating concept of a configuration example of a signal processing circuit according to the fourth exemplary embodiment. FIG. 13 only illustrates blocks used for the description of the fourth exemplary embodiment, and the illustration of components described in the first exemplary embodiment is omitted.

Pixels 1031, 1032, 1033, and 1034 are signal processing circuits that share the frequency divider circuit 221 and the selection circuit 226. These four pixels can form a Bayer array. The Bayer array is an example. Depending on the number of pixels, pixels can be grouped for every plurality of rows or every plurality of columns, or pixels need not be uniformly grouped in a same unit or circuit over the entire screen.

Outputs from illuminance determination circuits 2231, 2232, 2233, and 2234 of the respective pixels are supplied to the frequency divider circuit 221 and the selection circuit 226 via an AND circuit 235. In a case where each illuminance determination circuit outputs 1 when determining that an illuminance is high and outputs 0 when determining that an illuminance is low, the frequency divider circuit 221 divides the frequency of the control signal P_CLK into a half frequency, and the selection circuit 226 selects the control signal CTIME1, in a case where all the four pixels have determined that an illuminance is high. Each illuminance determination circuit can output 0 when determining that an illuminance is high and output 1 when determining that an illuminance is low. The AND circuit 235 can include another logic circuit, such as an OR circuit.

A common control signal P_CLK of which the frequency has been divided by the frequency divider circuit 221 is supplied to photon pulse generation circuits 2201, 2202, 2203, and 2204 of the respective pixels. In addition, a common control signal CTIME selected by the selection circuit 226 is supplied to the illuminance determination circuits.

In a case where neighboring pixels use control signals P_CLK having different frequency division ratios, a gradation difference or unevenness might appear as flickering in an image if both of the neighboring pixels are saturated early. In the fourth exemplary embodiment, such unevenness and flickering can be suppressed by a group of a plurality of pixels using the control signals P_CLK having a common frequency division ratio. Moreover, a circuit scale can be reduced because the frequency divider circuit 221 and the selection circuit 226 can be shared by two or more pixels.

In the first to fourth exemplary embodiments, the time counter circuit 222 is included for each pixel. In contrast, in a fifth exemplary embodiment, the time counter circuit 222 is shared by units of a plurality of pixels. For the sake of simplification of description, the time counter circuit 222 is shared by units of four pixels. However, the time counter circuit 222 can be shared by units of 16 pixels, for example, and the number of pixels is not limited to four.

Figure 14:
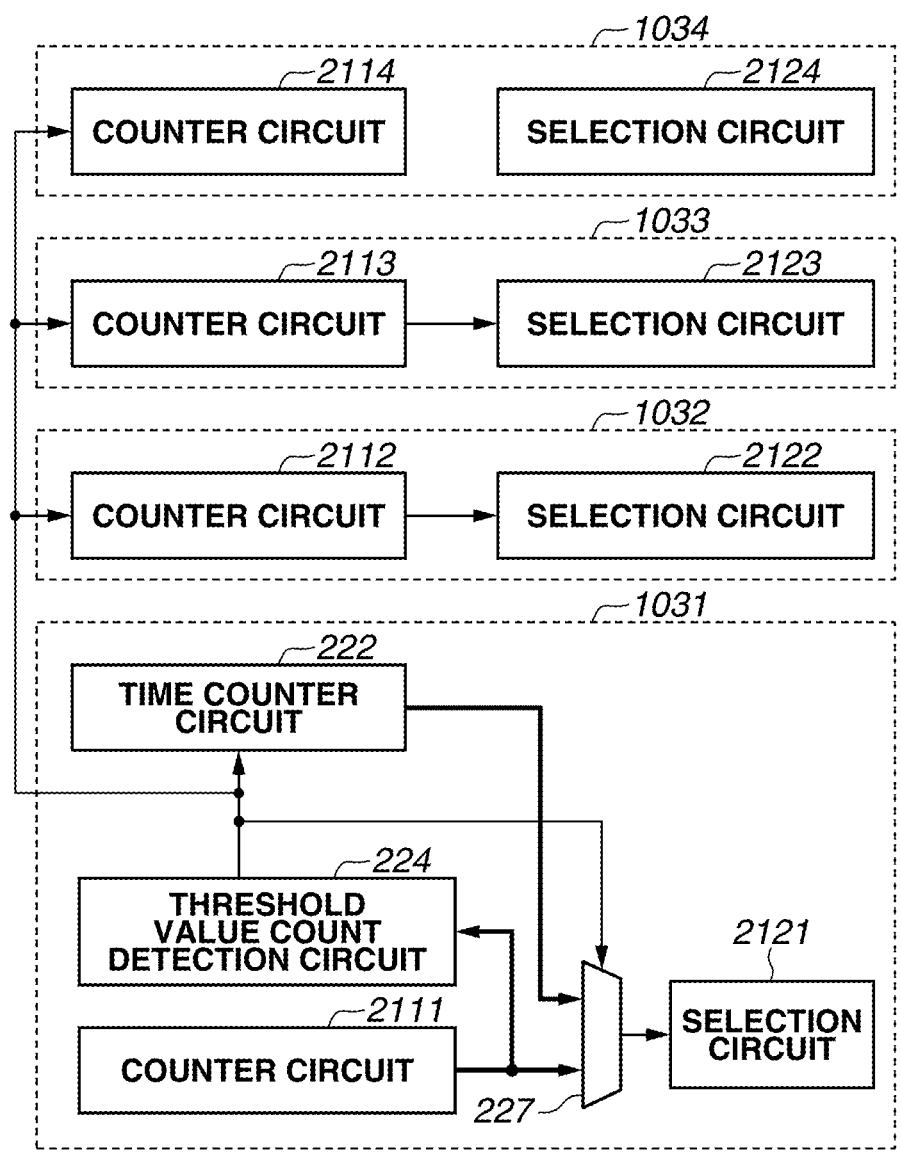
FIG. 14 is a schematic block diagram illustrating concept of a configuration example of a signal processing circuit according to a fifth exemplary embodiment.

FIG. 14 is a schematic diagram illustrating a concept of a configuration example of a signal processing circuit according to the fifth exemplary embodiment. FIG. 14 only illustrates blocks used for the description of the fifth exemplary embodiment, and the illustration of components described in the first exemplary embodiment is omitted.

Pixels 1031, 1032, 1033, and 1034 are signal processing circuits that share the time counter circuit 222. These four pixels can form a Bayer array. The Bayer array is an example. The time counter circuit 222 can be shared for each row, for every plurality of rows, for each column, or for every plurality of columns.

For example, a color filter is not provided only in a pixel 101 connected to the signal processing circuit 1031, and the other three pixels are mounted with red, green, and blue color filters. In this case, a counter circuit 2111 of the signal processing circuit 1031 connected to the pixel 101 not having a color filter is saturated earlier than counter circuits 2112, 2113, and 2114 of the other three pixels.

If the threshold value count detection circuit 224 detects that a count value of the counter circuit 2111 has reached a saturation value, the threshold value count detection circuit 224 notifies the time counter circuit 222 and the counter circuits 2112, 2113, 2114 of the other three pixels of the detection results.

Similarly to the first exemplary embodiment, the time counter circuit 222 stops counting if the time counter circuit 222 is notified by the threshold value count detection circuit 224 that a count value of the counter circuit 2111 has reached the saturation value within a period of one frame. Similarly, the counter circuits 2112, 2113, and 2114 stop counting if the counter circuits 2112, 2113, and 2114 of the other three pixels are notified by the threshold value count detection circuit 224 that a count value of the counter circuit 2111 has reached the saturation value within a period of one frame.

In the configuration according to the fifth exemplary embodiment, the counter circuits 2112, 2113, and 2114 connected to the three pixels having color filters are not saturated earlier than the counter circuit 2111. Thus, output formats of the signal processing circuits 1032, 1033, and 1034 become the output format 701 illustrated in FIG. 7A. In the fifth exemplary embodiment, the counter circuit 2111 is saturated earlier than the counter circuits 2112, 2113, and 2114 of the other three pixels. However, the configuration is not limited to this. For example, if any counter circuit is saturated, the time counter circuit 222 and counter circuits of the other three pixels can stop.

The time counter circuit 222 is, for example, a 14-bit counter, and has a large circuit scale. Thus, a pixel size becomes large if the time counter circuit 222 is provided in the signal processing circuit 103 of each pixel. In contrast, in the fifth exemplary embodiment, the time counter circuit 222 can be shared by two or more pixels, and thus a pixel size can be reduced and resolution can be enhanced by reducing a circuit scale.

Figure 15:
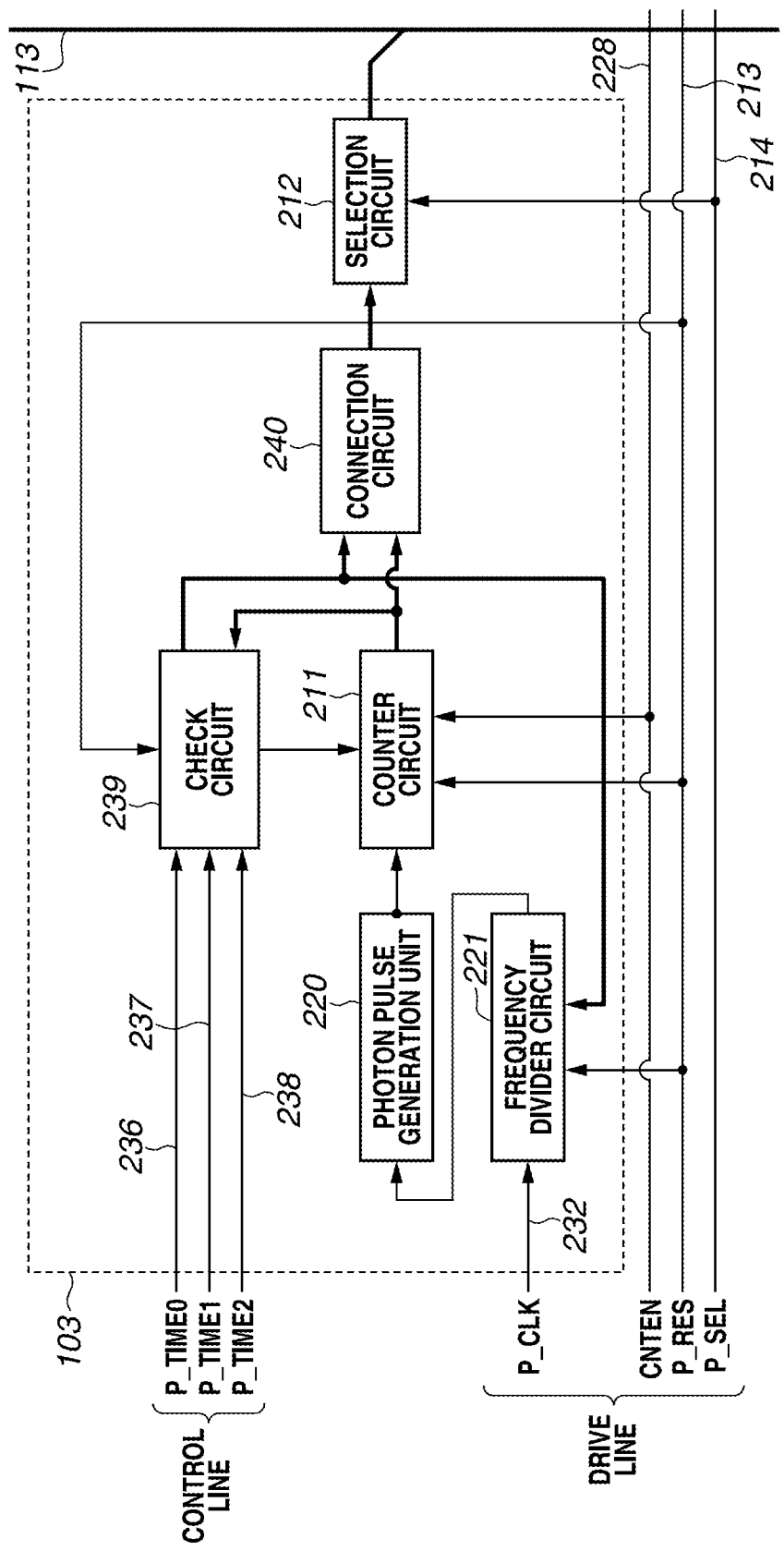
FIG. 15 is a block diagram illustrating a configuration example of a signal processing circuit according to a sixth exemplary embodiment.

FIG. 15 is a diagram illustrating a configuration example of a signal processing circuit 103 according to a sixth exemplary embodiment.

The signal processing circuit 103 includes the counter circuit 211, the selection circuit 212, the photon pulse generation circuit 220, the frequency divider circuit 221, a check circuit 239, and a connection circuit 240.

The photon pulse generation circuit 220 and the counter circuit 211 are similar to those described in the first exemplary embodiment.

The check circuit 239 refers to a control signal P_TIME supplied from the control pulse generation circuit 115, and refers to a count value of the counter circuit 211 at each input timing of the control signal P_TIME. If a count value of the counter circuit 211 has reached a predetermined threshold value at the timing, the counter circuit 211 is stopped. In the sixth exemplary embodiment, a control signal P_TIME0 is input at a time point at which ⅛ of a one-frame period has elapsed, a control signal P_TIME1 is input at a time point at which ¼ of the one-frame period has elapsed, and a control signal P_TIME2 is input at a time point at which ½ of the one-frame period has elapsed. In the sixth exemplary embodiment, the predetermined threshold value is set to an intermediate value (127) of a count value of an eight-bit counter. However, each input timing of the control signal P_TIME and the predetermined threshold value are not limited to these.

The check circuit 239 further outputs a timing at which a count value of the counter circuit 211 exceeds a threshold value, to the frequency divider circuit 221 and the connection circuit 240 as three-bit data. In a case where a count value of the counter circuit 211 has exceeded the threshold value of 127 at an input timing of the control signal P_TIME0, the check circuit 239 outputs 3b'111. In a case where a count value of the counter circuit 211 has exceeded the threshold value of 127 at an input timing of the control signal P_TIME1, the check circuit 239 outputs 3b'110. In a case where a count value of the counter circuit 211 has exceeded the threshold value of 127 at an input timing of the control signal P_TIME2, the check circuit 239 outputs 3b'100. In a case where a count value of the counter circuit 211 has not exceeded the threshold value of 127 at an input timing of the control signal P_TIME2, the check circuit 239 outputs 3b'000.

In accordance with three-bit timing information included in a notification transmitted from the check circuit 239, the frequency divider circuit 221 divides the frequency of the control signal P_CLK supplied from the signal generation circuit 215 via the vertical scanning circuit 110 and the drive line 232. In the sixth exemplary embodiment, a frequency division ratio is half frequency, but a frequency division ratio is to be designed using a value desirable from the aspect of a system. The frequency of the control signal P_CLK can be divided into a one-fourth frequency or a one-eighth frequency, or a plurality of frequency division ratios can be provided. In a case where the frequency of the control signal P_CLK has not been divided in a corresponding frame, the frequency divider circuit 221 determines that an illuminance in the frame is a high illuminance and divides the frequency of the control signal P_CLK into a half frequency, if the frequency divider circuit 221 receives a notification indicating 3'b111 from the check circuit 239, and does not divide the frequency under other conditions. In contrast, in a case where the frequency of the control signal P_CLK has been divided into a half frequency in a corresponding frame, if the frequency divider circuit 221 receives a notification indicating 3'b111 or 3'b110, from the check circuit 239, the frequency divider circuit 221 determines that an illuminance in the frame is a high illuminance and continues to divide the frequency of the control signal P_CLK into a half frequency, if the frequency divider circuit 221 receives a notification indicating 3'b111 from the check circuit 239. Under other conditions, the frequency divider circuit 221 does not divide the frequency of the control signal P_CLK. That is, a count speed of the counter circuit 211 becomes ½ even at the same illuminance, in a case where the frequency divider circuit 221 has divided the frequency of the control signal P_CLK into a half frequency. Thus, an illuminance is determined to be high, not only in a case where a count value of the counter circuit 211 has reached the threshold value at the time point at which ⅛ of a one-frame period has elapsed, but also in a case where a count value of the counter circuit 211 has reached the threshold value at the time point at which ¼ of a one-frame period has elapsed. In the sixth exemplary embodiment, the check circuit 239 stores a check result into a buffer or the like, and a frequency division ratio is switched at a timing at which the control pulse pRES is supplied to the frequency divider circuit 221 at the beginning of the next frame. Nevertheless, a frequency division ratio can be switched in real time at some point in a frame, for example.

The connection circuit 240 connects three-bit timing information from the check circuit 239 and an eight-bit count value from the counter circuit 211, and supplies the connected information to the selection circuit 212. In the sixth exemplary embodiment, the count value of the counter circuit 211 is to be output also in a case where the count value of the counter circuit 211 has exceeded the threshold value because a count value of the counter circuit 211 might have exceeded the threshold value at a timing at which the check circuit 239 has performed check.

The selection circuit 212 is similar to that described in the first exemplary embodiment.

Figure 16:
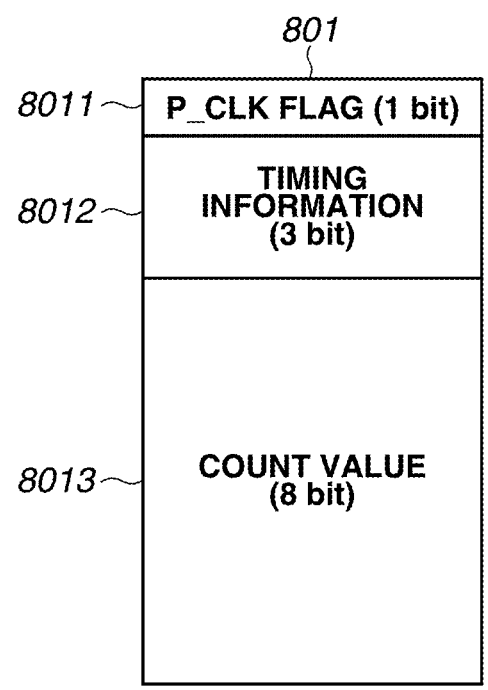
FIG. 16 illustrates an output format of a signal processing circuit according to the sixth exemplary embodiment.

FIG. 16 is a diagram illustrating an output format 801 of the signal processing circuit 103 according to the sixth exemplary embodiment.

At a most significant bit of the output format 801, a P_CLK flag 8011 is provided indicating whether the frequency of the control signal P_CLK has been divided into a half frequency in the subsequent processing (not illustrated). In the sixth exemplary embodiment, 0 indicates an undivided frequency and 1 indicates a half-divided frequency. A value of either 0 or 1 is stored in the P_CLK flag 8011. A frequency division ratio is to be designed using a value desirable from the aspect of a system. The frequency of the control signal P_CLK can be divided into a one-fourth frequency or a one-eighth frequency. In addition, a plurality of frequency division ratios can be provided by expanding the P_CLK flag 8011 to a plurality of bits.

In the output format 801, a three-bit region 8012 storing timing information of the check circuit 239 is provided.

At lower eight bits of the output format 801, a region 8013 storing a count value of the counter circuit 211 is provided.

In a case where timing information indicates 3'b111, the check circuit 239 determines that an illuminance in a corresponding frame is a high illuminance, and sets 1 to the P_CLK flag 8011. In a case where timing information indicates 3'b110 and the frequency of the control signal P_CLK has been divided into a half frequency in a corresponding frame, the check circuit 239 determines that an illuminance in the corresponding frame is a high illuminance, and sets 1 to the P_CLK flag 8011. Under other conditions, the check circuit 239 determines that an illuminance in a corresponding frame is a low illuminance, and sets 0 to the P_CLK flag 8011. The output format 801 is formed in this manner.

In the sixth exemplary embodiment, the check circuit 239 stores a check result into a buffer or the like, and a frequency division ratio is switched at a timing at which the control pulse pRES is supplied to the frequency divider circuit 221 at the beginning of the next frame. However, the configuration is not limited to this. For example, a frequency division ratio can be switched in real time at some point in a frame. In this case, a flag indicating that a frequency division ratio has been switched at some point in a frame, and information indicating a time at which the frequency division ratio has been switched are added to the output format 801.

The subsequent processing (not illustrated) calculates the number of photons per frame from received data.

First of all, the subsequent processing (not illustrated) refers to the P_CLK flag 8011 in the received data, and corrects a count value stored in the region 8013, in accordance with a value indicated by the P_CLK flag 8011. In a case where the P_CLK flag 8011 indicates 0, the frequency of the control signal P_CLK has been undivided, and the count value stored in the region 8013 is not corrected. In a case where the P_CLK flag 8011 indicates 1, the frequency of the control signal P_CLK has been divided into a half frequency, and the count value stored in the region 8013 is doubled. In a case where the frequency of the control signal P_CLK has been divided into a half frequency, the count value stored in the region 8013 is corrected by doubling the count value because a count speed of the counter circuit 211 becomes ½ even at the illuminance as compared with a case where the frequency of the control signal P_CLK has been undivided.

The count value stored in the region 8013 that has not been corrected in a case where the P_CLK flag 8011 indicates 0, and the count value stored in the region 8013 that has been corrected in a case where the P_CLK flag 8011 indicates 1 are uniformly regarded as a corrected value C. The subsequent processing (not illustrated) calculates the number of photons per frame from the corrected value C and the timing information stored in the region 8012 in the received data.

In a case where the timing information stored in the region 8012 indicates 3'b111, the count value of the counter circuit 211 has exceeded the threshold value of 127 at the time point at which ⅛ of a one-frame period has elapsed. The number of photons CNT per frame is calculated from the corrected value C using the following formula (4).

$$CNT = C \times 8 \quad (4)$$

In a case where the timing information stored in the region 8012 indicates 3'b110, the count value of the counter circuit 211 has exceeded the threshold value of 127 at the time point at which ¼ of a one-frame period has elapsed. The number of photons CNT per frame is calculated from the corrected value C using the following formula (5).

$$CNT = C \times 4 \quad (5)$$

In a case where the timing information stored in the region 8012 indicates 3'b100, the count value of the counter circuit 211 has exceeded the threshold value of 127 at the time point at which ½ of a one-frame period has elapsed. The number of photons CNT per frame is calculated from the corrected value C using the following formula (6).

$$CNT = C \times 2 \quad (6)$$

In a case where the timing information stored in the region 8012 indicates 3'b111, the count value of the counter circuit 211 has not exceeded the threshold value of 127 in a one-frame period, and the corrected value C is directly used as the number of photons CNT per frame.

In a frame with a high illuminance, a count speed of the counter circuit 211 becomes ½ even at the same illuminance in a case where the frequency divider circuit 221 has divided the frequency of the control signal P_CLK into a half frequency. Thus, a time until the threshold value count detection circuit 224 detects saturation becomes a doubled time as compared with a case where the frequency of the control signal P_CLK is undivided. In contrast, in a case where the frequency divider circuit 221 has divided the frequency of the control signal P_CLK into a half frequency, a frequency of the recharge operation becomes ½ even at the same illuminance. As compared with a case where the frequency of the control signal P_CLK is undivided, a frequency at which a recharge current and an avalanche current flow also becomes ½. With this configuration, power consumption can be leveled within one frame in a case where the frequency divider circuit 221 has divided the frequency of the control signal P_CLK into a half frequency, as compared with a case where the frequency of the control signal P_CLK is undivided.

As described above, according to the sixth exemplary embodiment, power consumption can be leveled within one frame with a high illuminance, by the frequency divider circuit 221 dividing the frequency of the control signal P_CLK into a half frequency.

Figure 17:
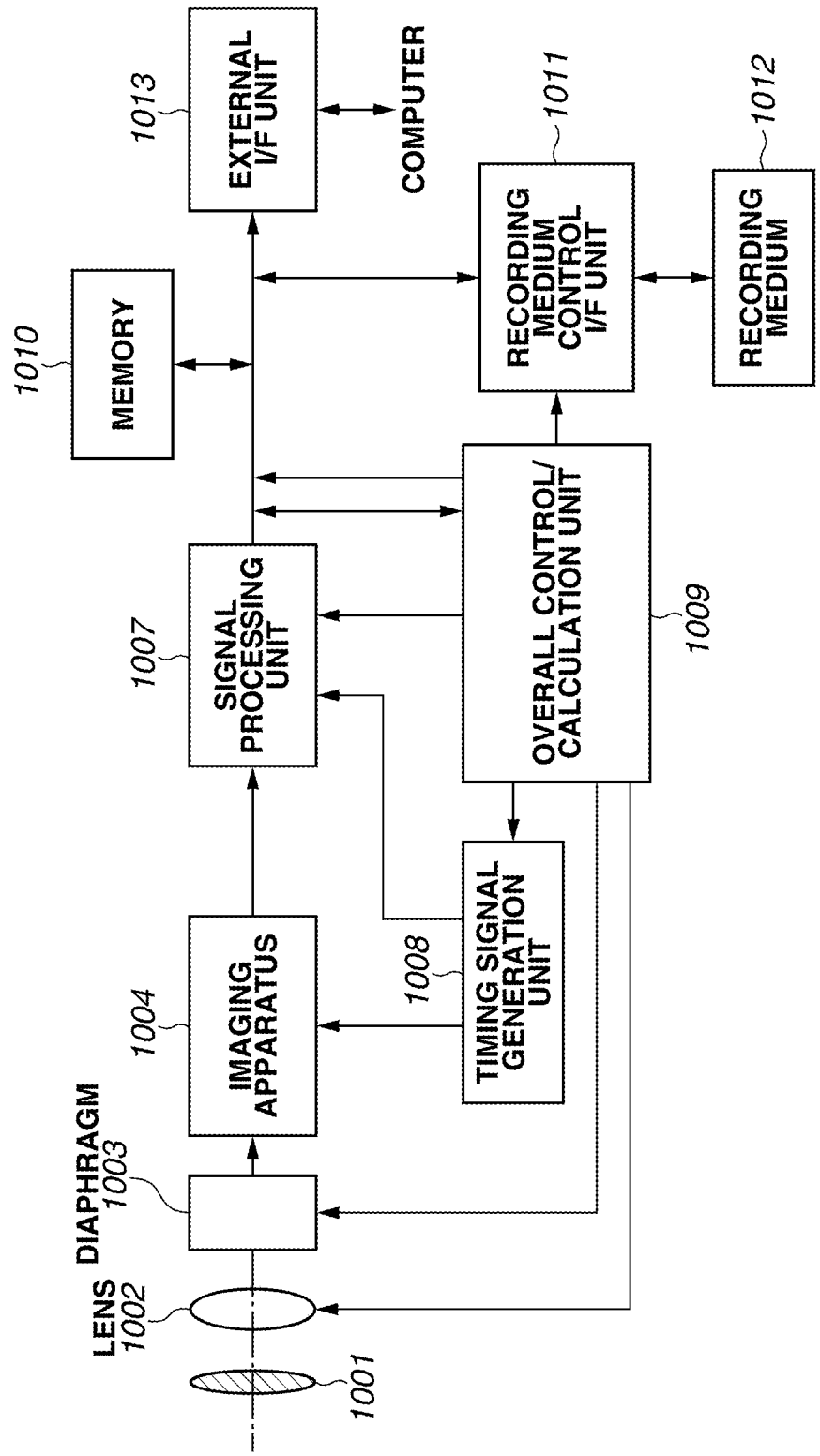
FIG. 17 is a functional block diagram of a photoelectric conversion system according to a seventh exemplary embodiment.

A photoelectric conversion system according to a seventh exemplary embodiment will now be described with reference to FIG. 17. FIG. 17 is a block diagram illustrating a schematic configuration of the photoelectric conversion system according to the present exemplary embodiment.

The photoelectric conversion apparatuses according to the above-described first to sixth exemplary embodiments can be applied to various photoelectric conversion systems. Examples of photoelectric conversion systems to which the photoelectric conversion apparatus can be applied include a digital still camera, a digital camcorder, a monitoring camera, a copier, a facsimile, a mobile phone, an in-vehicle camera, and an observation satellite. A camera module including an optical system such as a lens, and an imaging apparatus is also included in the photoelectric conversion systems. As an example of these photoelectric conversion systems, FIG. 17 exemplarily illustrates a block diagram of a digital still camera.

The photoelectric conversion system exemplified in FIG. 17 includes an imaging apparatus 1004 serving as an example of the photoelectric conversion apparatus, and a lens 1002 that forms an optical image of a subject on the imaging apparatus 1004. The photoelectric conversion system further includes a diaphragm 1003 for varying an amount of light passing through the lens 1002, and a barrier 1001 for protecting the lens 1002. The lens 1002 and the diaphragm 1003 serve as an optical system that focuses light onto the imaging apparatus 1004. The imaging apparatus 1004 is the photoelectric conversion apparatus according to any of the above-described exemplary embodiments, and converts an optical image formed by the lens 1002, into an electric signal.

The photoelectric conversion system further includes a signal processing unit or circuit 1007 serving as an image generation circuit that generates an image by processing an output signal output by the imaging apparatus 1004. The signal processing circuit 1007 performs an operation of outputting image data after performing various types of correction and compression as necessary. The signal processing circuit 1007 can be formed on a semiconductor substrate on which the imaging apparatus 1004 is provided. Alternatively, the signal processing circuit 1007 can be formed on a semiconductor substrate different from that of the imaging apparatus 1004.

The photoelectric conversion system further includes a memory 1010 for temporarily storing image data, and an external interface unit or circuit (external OF unit or circuit) 1013 for communicating with an external computer. The photoelectric conversion system further includes a recording medium 1012, such as a semiconductor memory, for recording or reading out captured image data, and a recording medium control interface unit or circuit (recording medium control OF unit or circuit) 1011 for performing recording onto or reading out from the recording medium 1012. The recording medium 1012 can be built into the photoelectric conversion system. Alternatively, the recording medium 1012 can be detachably attached to the photoelectric conversion system.

The photoelectric conversion system further includes an overall control/calculation unit or circuit 1009 that controls various types of calculation and the entire digital still camera, and a timing signal generation unit or circuit 1008 that outputs various timing signals to the imaging apparatus 1004 and the signal processing circuit 1007. The timing signals can be input from the outside. The photoelectric conversion system is to include at least the imaging apparatus 1004 and the signal processing circuit 1007 that processes an output signal output from the imaging apparatus 1004.

The imaging apparatus 1004 outputs an imaging signal to the signal processing circuit 1007. The signal processing circuit 1007 outputs image data after performing predetermined signal processing on the imaging signal output from the imaging apparatus 1004. The signal processing circuit 1007 generates an image using the imaging signal.

In this manner, according to the present exemplary embodiment, a photoelectric conversion system can be realized to which the photoelectric conversion apparatus (imaging apparatus) according to any of the above-described exemplary embodiments is applied.

Figure 18A:
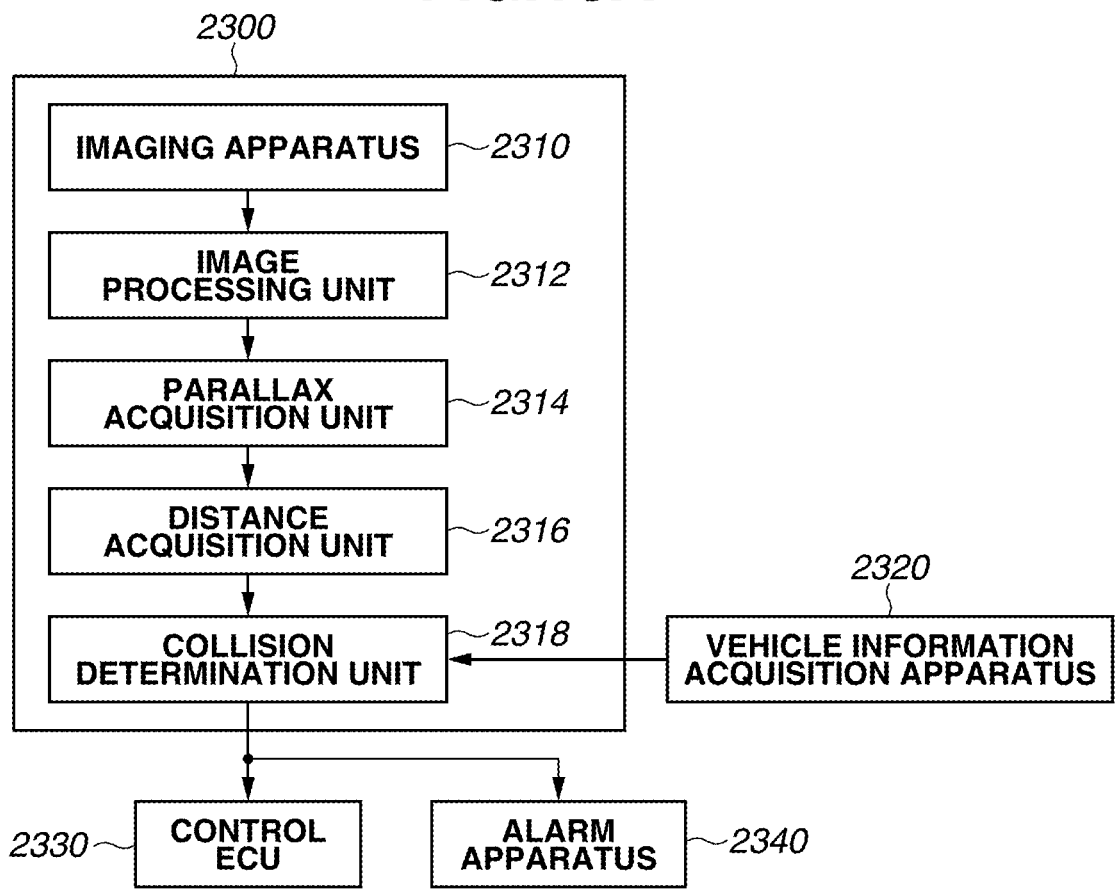
FIGS. 18A and 18B are functional block diagrams of a photoelectric conversion system according to an eighth exemplary embodiment.
Figure 18B:
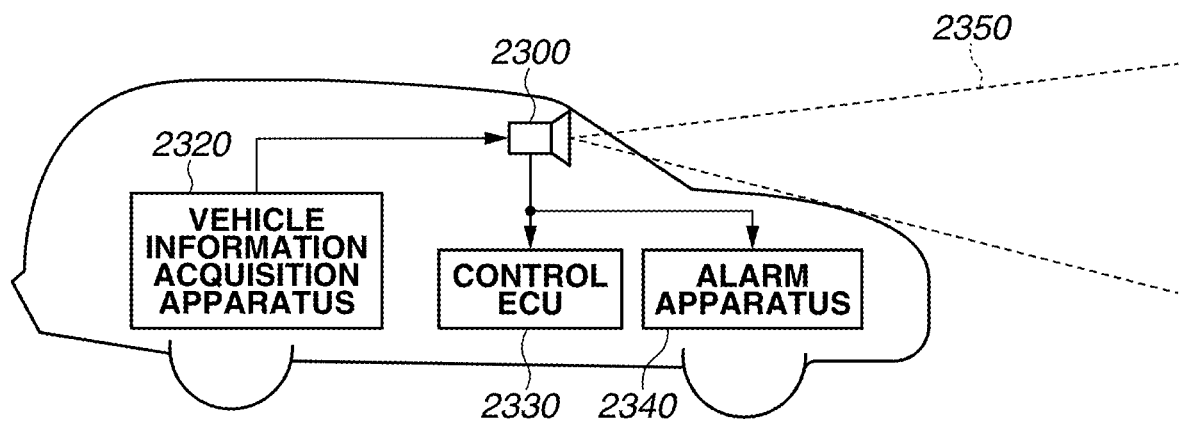

A photoelectric conversion system and a moving body according to an eighth exemplary embodiment will now be described with reference to FIGS. 18A and 18B. FIGS. 18A and 18B are diagrams illustrating configurations of the photoelectric conversion system and the moving body according to the present exemplary embodiment.

FIG. 18A illustrates an example of a photoelectric conversion system related to an in-vehicle camera. A photoelectric conversion system 2300 includes an imaging apparatus 2310. The imaging apparatus 2310 is the photoelectric conversion apparatus according to any of the above-described exemplary embodiments. The photoelectric conversion system 2300 includes an image processing unit or circuit 2312 that performs image processing on a plurality of pieces of image data acquired by the imaging apparatus 2310. The photoelectric conversion system 2300 further includes a parallax acquisition unit or circuit 2314 that calculates a parallax (phase difference between parallax images) from the plurality of pieces of image data acquired by the photoelectric conversion system 2300. The photoelectric conversion system 2300 further includes a distance acquisition unit or circuit 2316 that calculates a distance to a target object based on the calculated parallax, and a collision determination unit or circuit 2318 that determines whether collision is likely to occur, based on the calculated distance. In this example, the parallax acquisition circuit 2314 and the distance acquisition circuit 2316 serve as an example of a distance information acquisition unit or circuit that acquires distance information regarding a distance to a target object. More specifically, the distance information is information regarding a parallax, a defocus amount, and a distance to a target object. The collision determination circuit 2318 can determine collision likelihood using any of these pieces of distance information. The distance information acquisition circuit can be implemented by dedicatedly-designed hardware, or can be implemented by a software module.

Alternatively, the distance information acquisition circuit can be implemented by a field programmable gate array (FPGA) or an application specific integrated circuit (ASIC), or can be implemented by the combination of these.

The photoelectric conversion system 2300 is connected with a vehicle information acquisition apparatus 2320, and can acquire vehicle information, such as a vehicle speed, a yaw rate, or a rudder angle. The photoelectric conversion system 2300 is also connected with a control electronic control unit or circuit (ECU) 2330. The ECU 2330 serves as a control unit or circuit that outputs a control signal for causing a vehicle to generate braking force, based on a determination result obtained by the collision determination circuit 2318. The photoelectric conversion system 2300 is also connected with an alarm apparatus 2340 that raises an alarm to a driver based on a determination result obtained by the collision determination circuit 2318. For example, in a case where the determination result obtained by the collision determination circuit 2318 indicates high collision likelihood, the control ECU 2330 performs vehicle control for avoiding collision or reducing damages by braking, releasing a gas pedal, or suppressing engine output. The alarm apparatus 2340 issues an alarm to a user by sounding an alarm such as sound, displaying warning information on a screen of a car navigation system, or vibrating a seatbelt or a steering wheel.

In the present exemplary embodiment, the photoelectric conversion system 2300 captures an image of the periphery of the vehicle, such as the front side or the rear side. FIG. 18B illustrates the photoelectric conversion system 2300 for capturing an image of a vehicle front side (imaging range 2350). The vehicle information acquisition apparatus 2320 issues an instruction to the photoelectric conversion system 2300 or the imaging apparatus 2310. With such a configuration, the accuracy of distance measurement can be enhanced.

The above description has been given of an example in which control is performed in such a manner as not to collide with another vehicle. The photoelectric conversion system can also be applied to the control for performing automatic driving by following another vehicle, or the control for performing automatic driving in such a manner as not to deviate from a lane. Furthermore, the photoelectric conversion system can be applied to a moving body (moving apparatus) such as a vessel, an aircraft, or an industrial robot aside from a vehicle such as an automobile. Moreover, the photoelectric conversion system can be applied to a device that extensively uses object recognition, such as an intelligent transport system (ITS), in addition to a moving body.

Figure 19:
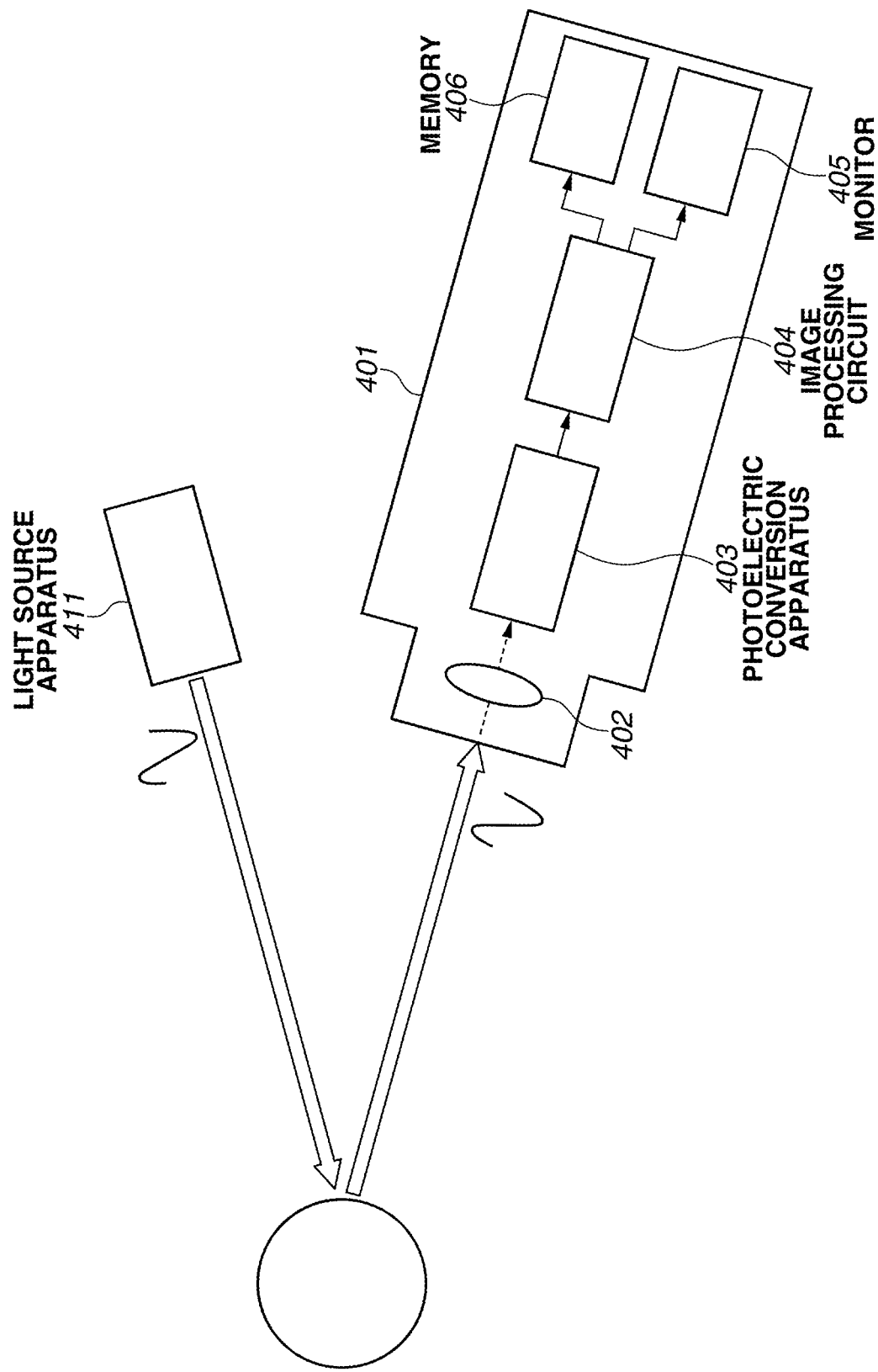
FIG. 19 is a functional block diagram of a photoelectric conversion system according to a ninth exemplary embodiment.

A photoelectric conversion system according to a ninth exemplary embodiment will be described with reference to FIG. 19. FIG. 19 is a block diagram illustrating a configuration example of a distance image sensor serving as the photoelectric conversion system according to the present exemplary embodiment.

As illustrated in FIG. 19, a distance image sensor 401 includes an optical system 402, a photoelectric conversion apparatus 403, an image processing circuit 404, a monitor 405, and a memory 406. The distance image sensor 401 can acquire a distance image corresponding to a distance to a subject, by receiving light (modulated light or pulse light) that has been projected from a light source apparatus 411 toward the subject, and reflected on the front surface of the subject.

The optical system 402 includes one or more lenses, and forms an image on a light receiving surface (sensor portion) of the photoelectric conversion apparatus 403 by guiding image light (incident light) from the subject to the photoelectric conversion apparatus 403.

The photoelectric conversion apparatus according to any of the above exemplary embodiments is applied as the photoelectric conversion apparatus 403. A distance signal indicating a distance obtained from a light receiving signal output from the photoelectric conversion apparatus 403 is supplied to the image processing circuit 404.

The image processing circuit 404 performs image processing of constructing a distance image, based on the distance signal supplied from the photoelectric conversion apparatus 403. The distance image (image data) obtained by the image processing is supplied to the monitor 405 and displayed thereon, or supplied to the memory 406 and stored (recorded) therein.

By applying the above-described photoelectric conversion apparatus, the distance image sensor 401 having the above-described configuration can acquire an accurate distance image in accordance with characteristic enhancement of a pixel, for example.

Figure 20:
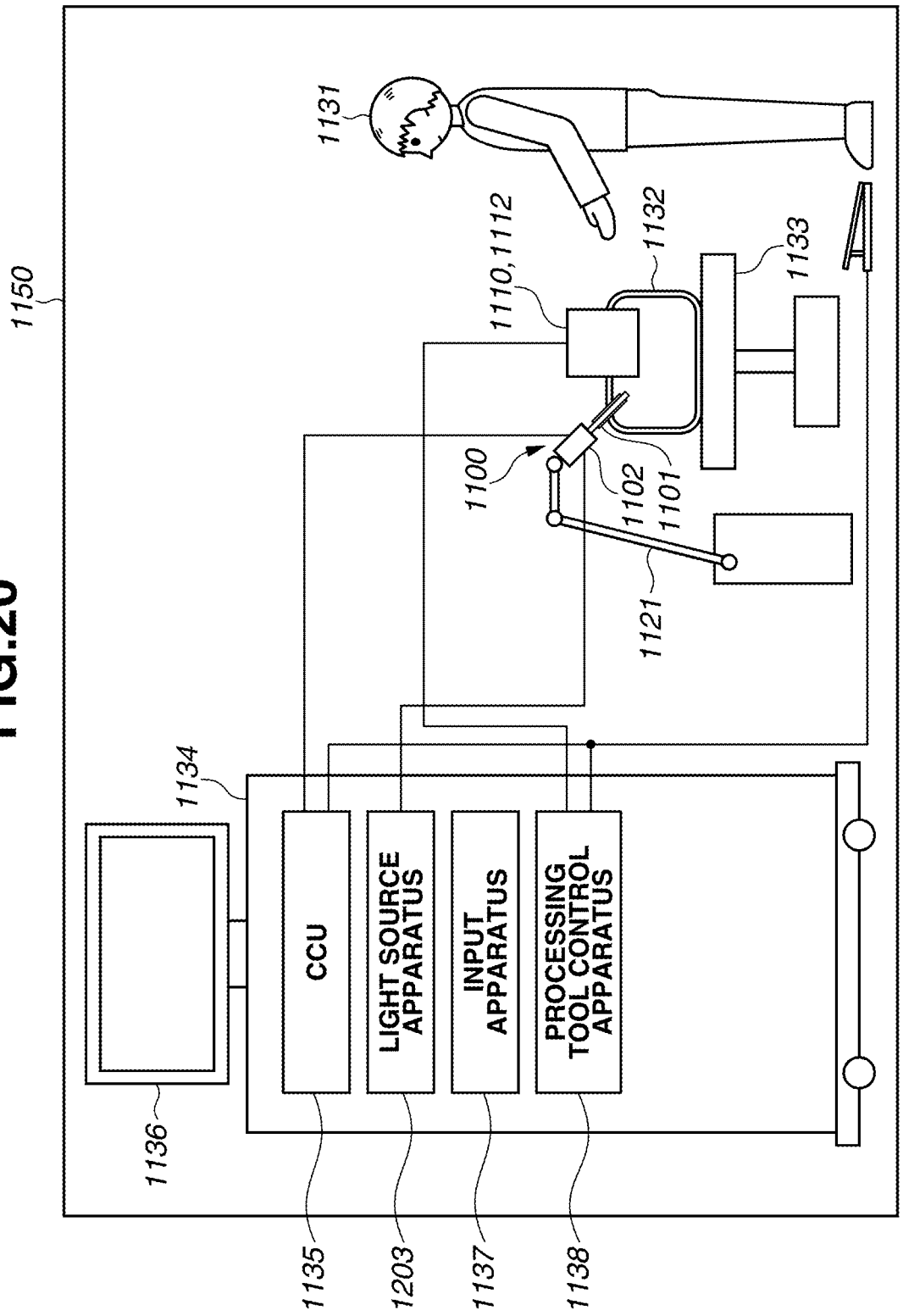
FIG. 20 is a functional block diagram of a photoelectric conversion system according to a tenth exemplary embodiment.

A photoelectric conversion system according to a tenth exemplary embodiment will now be described with reference to FIG. 20. FIG. 20 is a block diagram illustrating an example of a schematic configuration of an endoscopic operation system serving as a photoelectric conversion system according to the present exemplary embodiment.

FIG. 20 illustrates a state in which an operator (doctor) 1131 is performing an operation on a patient 1132 lying on a patient bed 1133, using an endoscopic operation system 1150. As illustrated in FIG. 20, the endoscopic operation system 1150 includes an endoscope 1100, a surgical tool 1110, and a cart 1134 equipped with various apparatuses for an endoscopic operation.

The endoscope 1100 includes a lens barrel 1101 having a region to be inserted into a body cavity of the patient 1132 by a predetermined length from a distal end, and a camera head 1102 connected to a proximal end of the lens barrel 1101. In the example illustrated in FIG. 20, the endoscope 1100 formed as a so-called rigid scope including the rigid lens barrel 1101 is illustrated. However, the endoscope 1100 can be formed as a so-called flexible scope including a flexible lens barrel.

An opening portion into which an objective lens is fitted is provided at the distal end of the lens barrel 1101. A light source apparatus 1203 is connected to the endoscope 1100, and light generated by the light source apparatus 1203 is guided to the distal end of the lens barrel 1101 by a light guide extended inside the lens barrel 1101. The light is emitted onto an observation target in the body cavity of the patient 1132 via the objective lens. The endoscope 1100 can be a direct view endoscope, or can be an oblique view endoscope or a lateral view endoscope.

An optical system and a photoelectric conversion apparatus are provided inside the camera head 1102. Reflected light (observation light) from an observation target is focused by the optical system to the photoelectric conversion apparatus. The observation light is photoelectrically-converted by the photoelectric conversion apparatus, and an electric signal corresponding to the observation light (i.e., image signal corresponding to an observed image) is generated. The photoelectric conversion apparatus according to any of the above exemplary embodiments can be used as the photoelectric conversion apparatus. The image signal is transmitted to a camera control unit (CCU) 1135 as RAW data.

The CCU 1135 includes a central processing unit (CPU) or a graphics processing unit (GPU), and comprehensively controls operations of the endoscope 1100 and a display device 1136. The CCU 1135 receives an image signal from the camera head 1102, and performs various types of image processing for displaying an image that is based on the image signal, such as development processing (demosaic processing), on the image signal.

Based on the control from the CCU 1135, the display device 1136 displays an image that is based on an image signal on which image processing has been performed by the CCU 1135.

The light source apparatus 1203 includes a light source, such as a light emitting diode (LED), and supplies irradiating light for capturing an image of an operative site, to the endoscope 1100.

An input apparatus 1137 is an input interface for the endoscopic operation system 1150. A user can input various types of information and instructions to the endoscopic operation system 1150 via the input apparatus 1137.

A processing tool control apparatus 1138 controls the driving of an energy processing tool 1112 for cauterizing or cutting a tissue, or sealing a blood vessel.

The light source apparatus 1203 that supplies irradiating light for capturing an image of an operative site, to the endoscope 1100 can include, for example, an LED, a laser light source, or a white light source including a combination of these. In a case where a white light source includes a combination of RGB laser light sources, white balance of a captured image can be adjusted in the light source apparatus 1203 because output intensity and an output timing of each color (each wavelength) can be controlled highly accurately. In this case, an image corresponding to each of RGB can be captured in a time division manner by emitting laser light from each RGB laser light source onto an observation target in a time division manner and controlling the driving of an image sensor of the camera head 1102 in synchronization with the emission timing. By using this method, color image can be obtained without providing a color filter in the image sensor.

The driving of the light source apparatus 1203 can be controlled in such a manner as to change the intensity of light to be output, every predetermined time. It is possible to generate a high dynamic range image without so-called black underexposure and clipped whites by acquiring images in a time division manner by controlling the image sensor driving of the camera head 1102 in synchronization with the change timing of the light intensity, and combining the images.

The light source apparatus 1203 can be configured to supply light in a predetermined wavelength band adapted to special light observation. In the special light observation, for example, wavelength dependency of light absorption in body tissues is utilized. Specifically, an image of a predetermined tissue, such as a blood vessel in a superficial portion of a mucous membrane, is captured with high contrast, by emitting light in a narrower band as compared with irradiating light (i.e., white light) in normal observation.

Alternatively, fluorescent observation to obtain an image by fluorescence generated by emitting excitation light can be performed in special light observation. In the fluorescent observation, fluorescence from a body tissue can be observed by emitting excitation light onto the body tissue, or a fluorescent image can be obtained by locally injecting reagent, such as indocyanine green (ICG), into a body tissue and emitting excitation light suitable for a fluorescence wavelength of the reagent, onto the body tissue. The light source apparatus 1203 can be configured to supply narrow-band light and/or excitation light adapted to such special light observation.

Figure 21A:
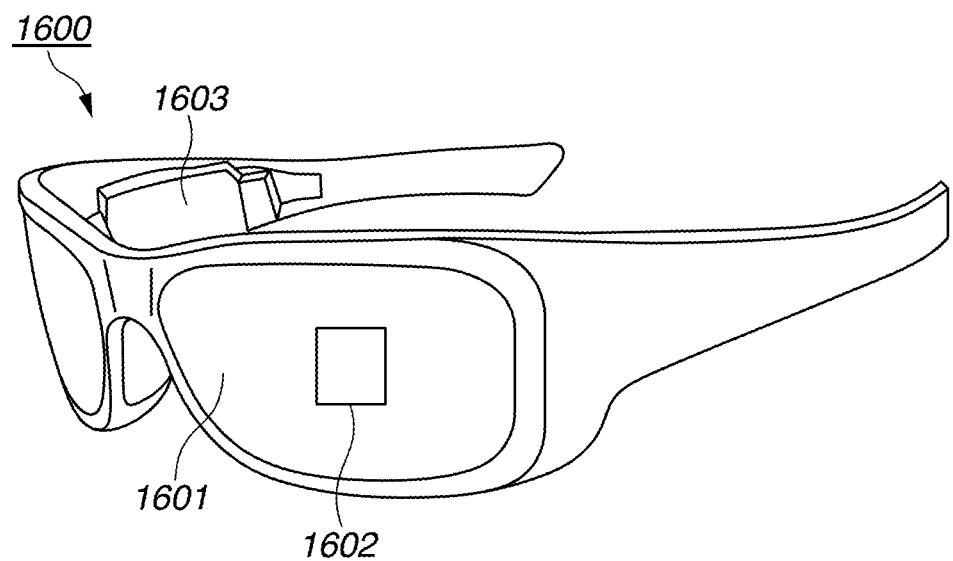
FIGS. 21A and 21B are functional block diagrams of a photoelectric conversion system according to an eleventh exemplary embodiment.

A photoelectric conversion system according to an eleventh exemplary embodiment will now be described with reference to FIGS. 21A and 21B. FIG. 21A illustrates eyeglasses 1600 (smart glasses) serving as a photoelectric conversion system according to the present exemplary embodiment. The eyeglasses 1600 include a photoelectric conversion apparatus 1602. The photoelectric conversion apparatus 1602 is the photoelectric conversion apparatus described in any of the above-described exemplary embodiments. On the back surface side of a lens 1601, a display device including a light emission device, such as an organic light emitting diode (OLED) or an LED, can be provided. The number of photoelectric conversion apparatuses 1602 can be one or plural. A plurality of types of photoelectric conversion apparatuses can also be used in combination. An arrangement position of the photoelectric conversion apparatus 1602 is not limited to the position illustrated in FIG. 21A.

The eyeglasses 1600 further include a control apparatus 1603. The control apparatus 1603 functions as a power source that supplies power to the photoelectric conversion apparatus 1602 and the above-described display device. The control apparatus 1603 also controls operations of the photoelectric conversion apparatus 1602 and the display device. In the lens 1601, an optical system for focusing light to the photoelectric conversion apparatus 1602 is formed.

Figure 21B:
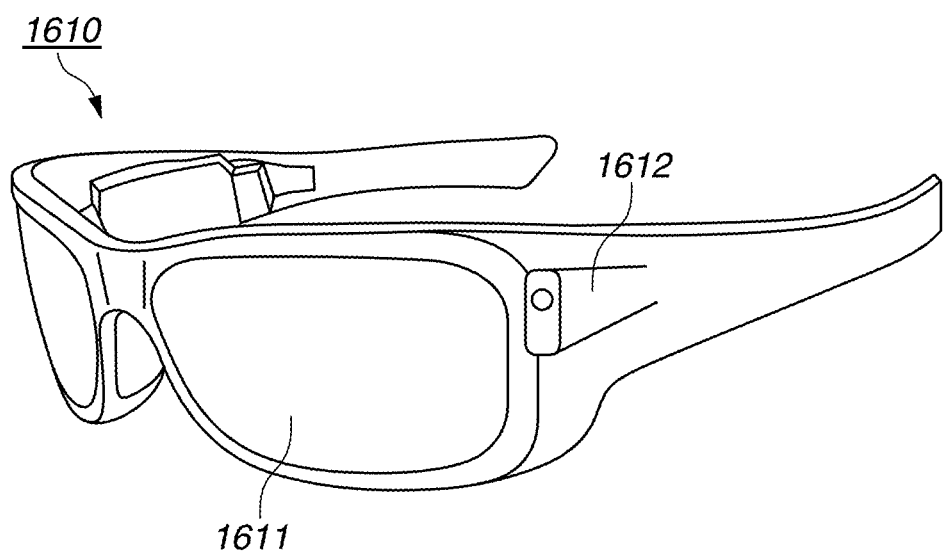

FIG. 21B illustrates eyeglasses 1610 (smart glasses) according to one application example. The eyeglasses 1610 include a control apparatus 1612. The control apparatus 1612 is equipped with a photoelectric conversion apparatus equivalent to the photoelectric conversion apparatus 1602, and a display device. In a lens 1611, the photoelectric conversion apparatus in the control apparatus 1612 and an optical system for projecting light emitted from the display device are formed. An image is projected onto the lens 1611. The control apparatus 1612 functions as a power source that supplies power to the photoelectric conversion apparatus and the display device, and controls operations of the photoelectric conversion apparatus and the display device. The control apparatus 1612 can include a visual line detection unit or circuit that detects a visual line of a wearer. Infrared light can be used for the visual line detection. An infrared light emission unit or circuit emits infrared light onto an eyeball of a user looking at a displayed image. An imaging unit or circuit including a light receiving element detects reflected light of the emitted infrared light that has been reflected from the eyeball. A captured image of the eyeball is thereby obtained. By including a reduction unit, element, or circuit for reducing light from the infrared light emission unit to a display unit or circuit in a planar view, a decline in image quality is suppressed.

From a captured image of an eyeball obtained by the image capturing using infrared light, a visual line of a user with respect to a displayed image is detected. Any known method can be applied to visual line detection that uses a captured image of an eyeball. As an example, a visual line detection method that is based on a Purkinje image obtained by reflection of irradiating light on a cornea can be used.

More specifically, visual line detection processing that is based on the pupil center corneal reflection is performed. A visual line of a user is detected by calculating an eye vector representing the direction (rotational angle) of an eyeball, based on an image of a pupil included in a captured image of the eyeball and a Purkinje image by using the pupil center corneal reflection.

The display device according to the present exemplary embodiment can include the photoelectric conversion apparatus including a light receiving element, and control a displayed image on the display device based on visual line information of the user from the photoelectric conversion apparatus.

Specifically, in the display device, a first eyeshot region viewed by the user, and a second eyeshot region other than the first eyeshot region are determined based on the visual line information. The first eyeshot region and the second eyeshot region can be determined by a control apparatus of the display device, or the first eyeshot region and the second eyeshot region determined by an external control apparatus can be received. In a display region of the display device, a display resolution of the first eyeshot region can be controlled to be higher than a display resolution of the second eyeshot region. In other words, a resolution of the second eyeshot region can be made lower than a resolution of the first eyeshot region.

The display region includes a first display region and a second display region different from the first display region. Based on the visual line information, a region with high priority can be determined from the first display region and the second display region. The first display region and the second display region can be determined by a control apparatus of the display device, or the first display region and the second display region determined by an external control apparatus can be received. A resolution of a region with high priority can be controlled to be higher than a resolution of a region other than the region with high priority. In other words, a resolution of a region with relatively-low priority can be set to a low resolution.

To determine the first eyeshot region and the region with high priority, artificial intelligence (AI) can be used. The AI can be a model configured to estimate an angle of a visual line, and a distance to a target object existing at the end of the visual line, from an image of an eyeball, by using teaching data including an image of the eyeball and a direction in which the eyeball in the image actually gives a gaze. An AI program can be included in the display device, can be included in the photoelectric conversion apparatus, or can be included in an external apparatus. In a case where an external apparatus includes an AI program, the AI program is transmitted to the display device through communication.

In a case where display control is performed based on visual detection, the disclosure can be desirably applied to smart glasses further including a photoelectric conversion apparatus that captures an image of the outside. The smart glasses can display external information obtained by image capturing in real time.

The disclosure is not limited to the above-described exemplary embodiments, and various modifications can be made.

For example, an example in which a partial configuration of a certain exemplary embodiment is added to another exemplary embodiment, and an example in which a partial configuration of a certain exemplary embodiment is replaced with a partial configuration of another exemplary embodiment are also included in the exemplary embodiments.

The photoelectric conversion systems described in the above-described seventh and eighth exemplary embodiments indicate examples of photoelectric conversion systems to which a photoelectric conversion apparatus can be applied, and a photoelectric conversion system to which a photoelectric conversion apparatus according to an exemplary embodiment can be applied is not limited to the configurations illustrated in FIGS. 17 and 18A and 18B. The same applies to the TOF system described in the ninth exemplary embodiment, the endoscope described in the tenth exemplary embodiment, and the smart glasses described in the eleventh exemplary embodiment.

Each of the above-described exemplary embodiments merely indicates a specific example in carrying out the disclosure, and the technical scope of the disclosure is not to be construed in a limiting manner based on these. In other words, exemplary embodiments of the disclosure can be implemented in various forms without departing from the technical ideas or major features thereof.

The present disclosure includes the following configurations.

(Configuration 1)

A photoelectric conversion apparatus comprising a plurality of pixels including a photodiode configured to perform avalanche multiplication, and a signal processing unit or circuit configured to generate a signal that is based on photons detected by the photodiode, wherein the signal processing circuit includes a control circuit, a counter, and an illuminance determination unit or circuit, wherein the control circuit is connected to the photodiode and a generation circuit configured to generate a pulse signal, and controls a state between a first state in which one node of the photodiode is not electrically connected to a predetermined potential and a second state in which the one node is electrically connected to the predetermined potential, in accordance with the pulse signal, wherein the counter counts the number of periods in which avalanche multiplication occurs, among a plurality of periods in the first state, wherein the illuminance determination circuit determines whether a count value of the counter has reached a threshold value, and wherein the signal processing circuit includes a unit, component, or circuit configured to set a frequency of the pulse signal in accordance with a result of determination performed by the illuminance determination circuit.

(Configuration 2)

A photoelectric conversion apparatus comprising a plurality of pixels including a photodiode configured to perform avalanche multiplication, and a signal processing unit or circuit configured to generate a signal that is based on photons detected by the photodiode, wherein the signal processing circuit includes a control circuit, a counter, and an illuminance determination unit or circuit, wherein the control circuit is connected to the photodiode and a generation circuit configured to generate a pulse signal, and controls a state between a first state in which one node of the photodiode is not electrically connected to a predetermined potential and a second state in which the one node is electrically connected to the predetermined potential, in accordance with the pulse signal, wherein the counter counts the number of periods in which avalanche multiplication occurs, among a plurality of periods in the first state, wherein the illuminance determination circuit determines whether a count value of the counter has reached a threshold value, and wherein the signal processing circuit includes a unit, component, or circuit configured to set an oscillation start timing of the pulse signal in accordance with a result of determination performed by the illuminance determination circuit.

(Configuration 3)

The photoelectric conversion apparatus according to Configuration 1 or 2, wherein the signal processing circuit includes an acquisition unit or circuit configured to acquire an exposure time.

(Configuration 4)

The photoelectric conversion apparatus according to Configuration 3, wherein the acquisition circuit is a time counter configured to measure an exposure time.

(Configuration 5)

The photoelectric conversion apparatus according to Configuration 3, wherein the acquisition circuit acquires timing information for referring to a determination result of the illuminance determination circuit is referred to.

(Configuration 6)

The photoelectric conversion apparatus according to Configuration 3, wherein the acquisition circuit acquires a time code indicating an exposure time.

(Configuration 7)

The photoelectric conversion apparatus according to Configuration 1 or 2, wherein the unit or circuit is a selection circuit configured to select either of a plurality of the pulse signals generated by the generation circuit.

(Configuration 8)

The photoelectric conversion apparatus according to Configuration 7, wherein a relative position in a first frame of a timing at which oscillation of the pulse signal is started in the first frame, and a relative position in a second frame of a timing at which oscillation of the pulse signal is started in the second frame are different.

(Configuration 9)

The photoelectric conversion apparatus according to Configuration 7, wherein the plurality of pixels is arranged on a plurality of rows and a plurality of columns, and forms a pixel array in which a first pixel group and a second pixel group are included, and wherein the selection circuit sets an oscillation start timing of the pulse signal to be supplied to the control circuit configured to control a pixel included in the first pixel group, and an oscillation start timing of the pulse signal to be supplied to the control circuit configured to control a pixel included in the second pixel group.

(Configuration 10)

The photoelectric conversion apparatus according to Configuration 9, wherein a relative position in a frame of a timing at which oscillation of the pulse signal is started in the first pixel group, and a relative position in the frame of a timing at which oscillation of the pulse signal is started in the second pixel group are different.

(Configuration 11)

The photoelectric conversion apparatus according to Configuration 1, wherein the circuit is a circuit configured to divide a frequency of the pulse signal generated by the generation circuit.

(Configuration 12)

The photoelectric conversion apparatus according to any one of Configurations 1 to 11, wherein, if a count value reaches the threshold value, the counter stops counting.

(Configuration 13)

The photoelectric conversion apparatus according to any one of Configurations 1 to 12, wherein the threshold value is a saturation value countable by the counter.

(Configuration 14)

The photoelectric conversion apparatus according to any one of Configurations 1 to 13, wherein the counter is shared by two or more pixels included in the plurality of pixels.

(Configuration 15)

The photoelectric conversion apparatus according to any one of Configurations 1 to 14, wherein the unit or circuit is shared by two or more pixels included in the plurality of pixels, and a common pulse signal is selected for the two or more pixels.

(Configuration 16)

The photoelectric conversion apparatus according to any one of Configurations 1 to 15, wherein the circuit changes the pulse signal from a high-frequency first pulse signal to a low-frequency second pulse signal.

(Configuration 17)

A photoelectric conversion system including the photoelectric conversion apparatus according to any one of Configurations 1 to 16, the photoelectric conversion system comprising a light emission unit or circuit configured to emit light to be detected by the photoelectric conversion apparatus, and a calculation unit or circuit configured to calculate a distance using a digital signal stored in the photoelectric conversion apparatus.

(Configuration 18)

A moving body comprising the photoelectric conversion apparatus according to any one of Configurations 1 to 16, an acquisition unit or circuit configured to acquire distance information regarding a distance to a target object, based on a signal from the photoelectric conversion apparatus, and a control unit or circuit configured to control the moving body based on the distance information.

According to the exemplary embodiments disclosure, it is possible to provide a photoelectric conversion apparatus in which power consumption is leveled within a frame.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-080115, filed May 16, 2022, which is hereby incorporated by reference herein in its entirety.

What is claimed is:

1. A photoelectric conversion apparatus comprising:
a plurality of pixels including a photodiode configured to perform avalanche multiplication; and
a signal processing circuit configured to generate a signal that is based on photons detected by the photodiode,
wherein the signal processing circuit includes a control circuit, a counter, and an illuminance determination circuit,
wherein the control circuit is connected to the photodiode and a generation circuit configured to generate a pulse signal, and controls a state between a first state in which one node of the photodiode is not electrically connected to a predetermined potential and a second state in which the one node is electrically connected to the predetermined potential, in accordance with the pulse signal,
wherein the counter counts a number of periods in which avalanche multiplication occurs, among a plurality of periods in the first state,
wherein the illuminance determination circuit determines whether a count value of the counter has reached a threshold value, and
wherein the signal processing circuit includes a circuit configured to set a frequency of the pulse signal in accordance with a result of determination performed by the illuminance determination circuit.

2. The photoelectric conversion apparatus according to claim 1, wherein the signal processing circuit includes an acquisition circuit configured to acquire an exposure time.

3. The photoelectric conversion apparatus according to claim 2, wherein the acquisition circuit is a time counter configured to measure an exposure time.

4. The photoelectric conversion apparatus according to claim 2, wherein the acquisition circuit acquires timing information for referring to a determination result of the illuminance determination circuit is referred to.

5. The photoelectric conversion apparatus according to claim 2, wherein the acquisition circuit acquires a time code indicating an exposure time.

6. The photoelectric conversion apparatus according to claim 1, wherein the circuit is a selection circuit configured to select either of a plurality of the pulse signals generated by the generation circuit.

7. The photoelectric conversion apparatus according to claim 1, wherein the circuit is a circuit configured to divide a frequency of the pulse signal generated by the generation circuit.

8. The photoelectric conversion apparatus according to claim 1, wherein, if a count value reaches the threshold value, the counter stops counting.

9. The photoelectric conversion apparatus according to claim 1, wherein the threshold value is a saturation value countable by the counter.

10. The photoelectric conversion apparatus according to claim 1, wherein the counter is shared by two or more pixels included in the plurality of pixels.

11. The photoelectric conversion apparatus according to claim 1, wherein the circuit is shared by two or more pixels included in the plurality of pixels, and a common pulse signal is selected for the two or more pixels.

12. The photoelectric conversion apparatus according to claim 1, wherein the circuit changes the pulse signal from a high-frequency first pulse signal to a low-frequency second pulse signal.

13. A photoelectric conversion system including the photoelectric conversion apparatus according to claim 1, the photoelectric conversion system comprising:
a light emission circuit configured to emit light to be detected by the photoelectric conversion apparatus; and
a calculation circuit configured to calculate a distance using a digital signal stored in the photoelectric conversion apparatus.

14. A moving body comprising:
the photoelectric conversion apparatus according to claim 1;
an acquisition circuit configured to acquire distance information regarding a distance to a target object, based on the signal from the photoelectric conversion apparatus; and
a control circuit configured to control the moving body based on the distance information.

15. A photoelectric conversion apparatus comprising:
a plurality of pixels including a photodiode configured to perform avalanche multiplication; and
a signal processing circuit configured to generate a signal that is based on photons detected by the photodiode,
wherein the signal processing circuit includes a control circuit, a counter, and an illuminance determination circuit,
wherein the control circuit is connected to the photodiode and a generation circuit configured to generate a pulse signal, and controls a state between a first state in which one node of the photodiode is not electrically connected to a predetermined potential and a second state in which the one node is electrically connected to the predetermined potential, in accordance with the pulse signal,
wherein the counter counts a number of periods in which avalanche multiplication occurs, among a plurality of periods in the first state,
wherein the illuminance determination circuit determines whether a count value of the counter has reached a threshold value, and
wherein the signal processing circuit includes a unit or circuit configured to set an oscillation start timing of the pulse signal in accordance with a result of determination performed by the illuminance determination circuit.

16. The photoelectric conversion apparatus according to claim 15, wherein the circuit is a selection circuit configured to select either of a plurality of the pulse signals generated by the generation circuit.

17. The photoelectric conversion apparatus according to claim 16, wherein a relative position in a first frame of a timing at which oscillation of the pulse signal is started in the first frame, and a relative position in a second frame of a timing at which oscillation of the pulse signal is started in the second frame are different.

18. The photoelectric conversion apparatus according to claim 16,
wherein the plurality of pixels is arranged on a plurality of rows and a plurality of columns, and forms a pixel array in which a first pixel group and a second pixel group are included, and
wherein the selection circuit sets an oscillation start timing of the pulse signal to be supplied to the control circuit configured to control a pixel included in the first pixel group, and an oscillation start timing of the pulse signal to be supplied to the control circuit configured to control a pixel included in the second pixel group.

19. The photoelectric conversion apparatus according to claim 18, wherein a relative position in a frame of a timing at which oscillation of the pulse signal is started in the first pixel group, and a relative position in the frame of a timing at which oscillation of the pulse signal is started in the second pixel group are different.

* * * * *